US012001288B2

(12) United States Patent
Desai et al.

(10) Patent No.: US 12,001,288 B2
(45) Date of Patent: Jun. 4, 2024

(54) DEVICES AND METHODS FOR SAFE MODE OF OPERATION IN EVENT OF MEMORY CHANNEL MISBEHAVIOR

(71) Applicant: QUALCOMM Incorporated, San Diego, CA (US)

(72) Inventors: Kunal Desai, Bangalore (IN); Kiran Kumar Malipeddi, San Diego, CA (US); Shekar Babu Merla, Bangalore (IN); Pranav Agrawal, Hyderabad (IN)

(73) Assignee: QUALCOMM Incorporated, San Diego, CA (US)

( * ) Notice: Subject to any disclaimer, the term of this patent is extended or adjusted under 35 U.S.C. 154(b) by 126 days.

(21) Appl. No.: 17/484,310

(22) Filed: Sep. 24, 2021

(65) Prior Publication Data

US 2023/0098902 A1  Mar. 30, 2023

(51) Int. Cl.
*G06F 11/00* (2006.01)
*G06F 11/14* (2006.01)
*G06F 13/16* (2006.01)
*G11C 29/38* (2006.01)

(52) U.S. Cl.
CPC ...... *G06F 11/1428* (2013.01); *G06F 11/1417* (2013.01); *G06F 13/1668* (2013.01); *G11C 29/38* (2013.01)

(58) Field of Classification Search
CPC .......... G06F 11/1428; G06F 11/1417; G06F 11/1668; G11C 29/38
See application file for complete search history.

(56) References Cited

U.S. PATENT DOCUMENTS

| 9,229,796 | B1* | 1/2016 | Ma | G06F 11/3452 |
| 9,904,556 | B1* | 2/2018 | Ellerbrock | G06F 9/4416 |
| 10,963,411 | B1 | 3/2021 | Voogel et al. | |
| 11,036,543 | B1* | 6/2021 | Swanson | G06F 13/102 |
| 2003/0037278 | A1* | 2/2003 | Olarig | G11C 29/76 714/5.1 |
| 2009/0006837 | A1* | 1/2009 | Rothman | G06F 11/1044 713/100 |

(Continued)

FOREIGN PATENT DOCUMENTS

EP   2680149 A1   1/2014

OTHER PUBLICATIONS

International Search Report and Written Opinion—PCT/US2022/041870—ISA/EPO—Dec. 20, 2022 14 pages.

*Primary Examiner* — Loan L. T. Truong
(74) *Attorney, Agent, or Firm* — The Marbury Law Group/Qualcomm

(57) ABSTRACT

Various embodiments may include methods and systems for reconfiguring memory channel routing within a system-on-a-chip (SoC). A method may include obtaining first error information in response to misbehavior in a first memory channel communicatively connected to a network interface unit (NIU) of the SoC. The method may further include storing the first error information in non-volatile memory that is read upon booting of the SoC, and rebooting the SoC including the first memory channel. The method may further include configuring the first memory channel to be communicatively disconnected from the NIU and configuring a second memory channel to be communicatively connected to the NIU in response to reading the stored first error information during reboot.

16 Claims, 9 Drawing Sheets

(56) References Cited

U.S. PATENT DOCUMENTS

| | | |
|---|---|---|
| 2014/0115281 A1* | 4/2014 | Coteus ................. G06F 3/0671 |
| | | 439/65 |
| 2014/0245079 A1* | 8/2014 | Larson ................ G06F 11/0772 |
| | | 714/48 |
| 2014/0355369 A1* | 12/2014 | Cordero ................ G11C 29/04 |
| | | 365/200 |
| 2015/0100848 A1* | 4/2015 | Kalamatianos ........ G11C 29/52 |
| | | 714/764 |
| 2015/0140986 A1* | 5/2015 | Lamb ................. H04L 41/0659 |
| | | 455/418 |
| 2015/0269096 A1* | 9/2015 | Cordero ............. G06F 13/1673 |
| | | 710/310 |
| 2017/0286128 A1* | 10/2017 | Yang ....................... G06F 9/445 |
| 2018/0074884 A1* | 3/2018 | Cady ................... G06F 11/0787 |
| 2018/0150347 A1* | 5/2018 | Chinnakkonda Vidyapoornachary ...................... G06F 11/1423 |
| 2018/0253314 A1* | 9/2018 | Packer Ali ............ G06F 9/4403 |
| 2019/0049916 A1* | 2/2019 | Deka ................... G06F 11/0796 |
| 2019/0250853 A1 | 8/2019 | Arbel et al. |
| 2019/0278651 A1* | 9/2019 | Thornley ............ G06F 11/0787 |
| 2019/0391868 A1* | 12/2019 | Chaudhari .......... G06F 11/0721 |
| 2020/0151070 A1 | 5/2020 | Lee et al. |
| 2020/0226045 A1* | 7/2020 | Le ............................ G06F 1/30 |
| 2021/0405114 A1* | 12/2021 | Srivastava ....... G01R 31/31712 |
| 2022/0206695 A1* | 6/2022 | Zhao ..................... G06F 3/0673 |
| 2023/0004649 A1* | 1/2023 | Su ....................... G06F 11/1469 |

* cited by examiner

DEVICES AND METHODS FOR SAFE MODE OF OPERATION IN EVENT OF MEMORY CHANNEL MISBEHAVIOR

BACKGROUND

System-on-a-chip (SoC) designs and devices involving multiple memory channels are becoming more complex, with increasing transaction speeds and implementing more complex configurations such as in a network-on-a-chip (NoC) configuration communicating with external memory devices. Higher transaction speeds and more complex configurations involving memory transactions may increase the occurrence of memory channel failure rates. In systems with multiple memory channels (e.g., 2, 4, 6, 8, etc. channels), a hard failure of one memory channel may cause the entire system to crash, causing limited to no functionality.

SUMMARY

Various aspects include methods and devices for reconfiguring memory channel routing within a system-on-a-chip (SoC). In various aspects a misbehaving memory channel may be identified through various error checking methods. Error information may be stored and read upon reboot of the SoC to reprogram control/status registers (CSRs) within a network-on-a-chip (NoC) implemented by the SoC. Reprogramming the CSRs may allow the NoC to reconfigure memory channel routing to divert memory traffic from a misbehaving memory channel to a functioning memory channel.

Some aspects may include a method for reconfiguring memory channel routing within a system-on-a-chip (SoC). Such aspects may include obtaining first error information in response to misbehavior in a first memory channel communicatively connected to a network interface unit (NIU) of the SoC; storing the first error information in non-volatile memory that is read upon booting of the SoC; rebooting the SoC including the first memory channel; and configuring the first memory channel to be communicatively disconnected from the NIU and configuring a second memory channel to be communicatively connected to the NIU in response to reading the stored first error information during reboot.

In some aspects, configuring the first memory channel to be communicatively disconnected from the NIU and configuring the second memory channel to be communicatively connected to the NIU in response to reading the stored first error information during reboot may include reprogramming control/status registers (CSRs) to adjust address mapping of the NIU to disconnect the NIU from the first memory channel and to connect the NIU to the second memory channel.

In some aspects, configuring the first memory channel to be communicatively disconnected from the NIU and configuring the second memory channel to be communicatively connected to the NIU in response to reading the stored first error information during reboot may include reprogramming control/status registers (CSRs) to configure a multiplexor to disconnect the NIU from the first memory channel and to connect the NIU to the second memory channel.

Some aspects may further include performing a built-in self-test on the first memory channel; generating second error information in response to the built-in self-test indicating no misbehavior in the first memory channel; and writing the second error information over the first error information in the non-volatile memory that is read upon booting of the SoC.

Some aspects may further include, in response to no misbehavior in the first memory channel, deleting the first error information from the non-volatile memory that is read upon booting of the SoC; and rebooting the SoC including the first memory channel and the second memory channel, in which rebooting with the first error information deleted from the non-volatile memory results in reconfiguring the first memory channel to be communicatively connected to the NIU and configuring the second memory channel to be communicatively disconnected from the NIU.

Some aspects may further include detecting misbehavior in the first memory channel based on at least one of error correction codes, parity bits corresponding to address mapping and control registers, or a timeout-per-transaction function.

Some aspects may further include detecting misbehavior in the first memory channel based on at least one of error correction codes to or from dynamic random-access memory (DRAM) of the first memory channel, error correction codes for LLCC cache, or error correction codes for LLCC tags.

In some aspects, configuring the first memory channel to be communicatively disconnected from the NIU and configuring a second memory channel to be communicatively connected to the NIU in response to reading the stored first error information during reboot may include in response to the stored first error information indicating misbehavior in a first physical interface (PHY) of the first memory channel, configuring the first memory channel to be communicatively disconnected from the NIU and a configuring second memory channel to be communicatively connected to the NIU, and configuring a second PHY of the second memory channel to be communicatively connected to dynamic random-access memory (DRAM) of the first memory channel.

In some aspects, configuring the first memory channel to be communicatively disconnected from the NIU and configuring the second memory channel to be communicatively connected to the NIU in response to reading the stored first error information during reboot may include, in response to the stored first error information indicating misbehavior in a first memory controller of the first memory channel, configuring the first memory channel to be communicatively disconnected from the NIU and configuring the second memory channel to be communicatively connected to the NIU; and configuring a second memory controller of the second memory channel to be communicatively connected a physical interface (PHY) of the of the first memory channel.

Further aspects include an SoC, including a network interface unit (NIU); a first memory channel capable of being communicatively connected to the NIU; a second memory channel capable of being communicatively connected to the NIU; and a non-volatile memory configured to store first error information that is read upon booting of the SoC; in which the SoC is configured to obtain the first error information in response to misbehavior in the first memory channel when communicatively connected to the NIU; store the first error information in the non-volatile memory; reboot the SoC including the first memory channel; and configure the first memory channel to be communicatively disconnected from the NIU and configure the second memory channel to be communicatively connected to the NIU in response to reading the stored first error information during reboot.

In some aspects, the SoC may be further configured to configure the first memory channel to be communicatively disconnected from the NIU and configure the second memory channel to be communicatively connected to the NIU in response to reading the stored first error information during reboot by reprogramming control/status registers (CSRs) to adjust address mapping of the NIU to disconnect the NIU from the first memory channel and to connect the NIU to the second memory channel.

In some aspects, the SoC may be further configured to configure the first memory channel to be communicatively disconnected from the NIU and configure the second memory channel to be communicatively connected to the NIU in response to reading the stored first error information during reboot by reprogramming control/status registers (CSRs) to configure a multiplexor to disconnect the NIU from the first memory channel and to connect the NIU to the second memory channel.

In some aspects, the SoC may be further configured to perform a built-in self-test on the first memory channel; generate second error information in response to the built-in self-test indicating no misbehavior in the first memory channel; and write the second error information over the first error information in the non-volatile memory that is read upon booting of the SoC.

In some aspects, the SoC may be further configured to, in response to no misbehavior in the first memory channel, delete the first error information from the non-volatile memory that is read upon booting of the SoC; and reboot the SoC including the first memory channel and the second memory channel, in which rebooting with the first error information deleted from the non-volatile memory results in reconfiguring the first memory channel to be communicatively connected to the NIU and configuring the second memory channel to be communicatively disconnected from the NIU.

In some aspects, the SoC may be further configured to detect misbehavior in the first memory channel based on at least one of error correction codes, parity bits corresponding to address mapping and control registers, or a timeout-per-transaction function.

In some aspects, the SoC may be further configured to detect misbehavior in the first memory channel based on at least one of error correction codes to or from dynamic random-access memory (DRAM) of the first memory channel, error correction codes for LLCC cache, or error correction codes for LLCC tags.

In some aspects, the SoC may be further configured to configure the first memory channel to be communicatively disconnected from the NIU and configure the second memory channel to be communicatively connected to the NIU in response to reading the stored first error information during reboot by, in response to the stored first error information indicating misbehavior in a first physical interface (PHY) of the first memory channel, configuring the first memory channel to be communicatively disconnected from the NIU and configuring the second memory channel to be communicatively connected to the NIU; and configuring a second PHY of the second memory channel to be communicatively connected to dynamic random-access memory (DRAM) of the first memory channel.

In some aspects, the SoC may be further configured to configure the first memory channel to be communicatively disconnected from the NIU and configure the second memory channel to be communicatively connected to the NIU in response to reading the stored first error information during reboot by, in response to the stored first error information indicating misbehavior in a first memory controller of the first memory channel, configuring the first memory channel to be communicatively disconnected from the NIU and configuring the second memory channel to be communicatively connected to the NIU; and configuring a second memory controller of the second memory channel to be communicatively connected a physical interface (PHY) of the of the first memory channel.

In some aspects, the first memory channel and the second memory channel are double data rate (DDR) channels.

Further aspects include an SoC having various means for performing functions corresponding to any of the methods summarized above. Further aspects may include a non-transitory processor-readable storage medium having stored thereon processor-executable instructions configured to cause a processor of an SoC to perform various operations corresponding to any of the methods summarized above.

BRIEF DESCRIPTION OF THE DRAWINGS

The accompanying drawings, which are incorporated herein and constitute part of this specification, illustrate exemplary embodiments, and together with the general description given above and the detailed description given below, serve to explain the features of the various embodiments.

DETAILED DESCRIPTION

Figure 1:
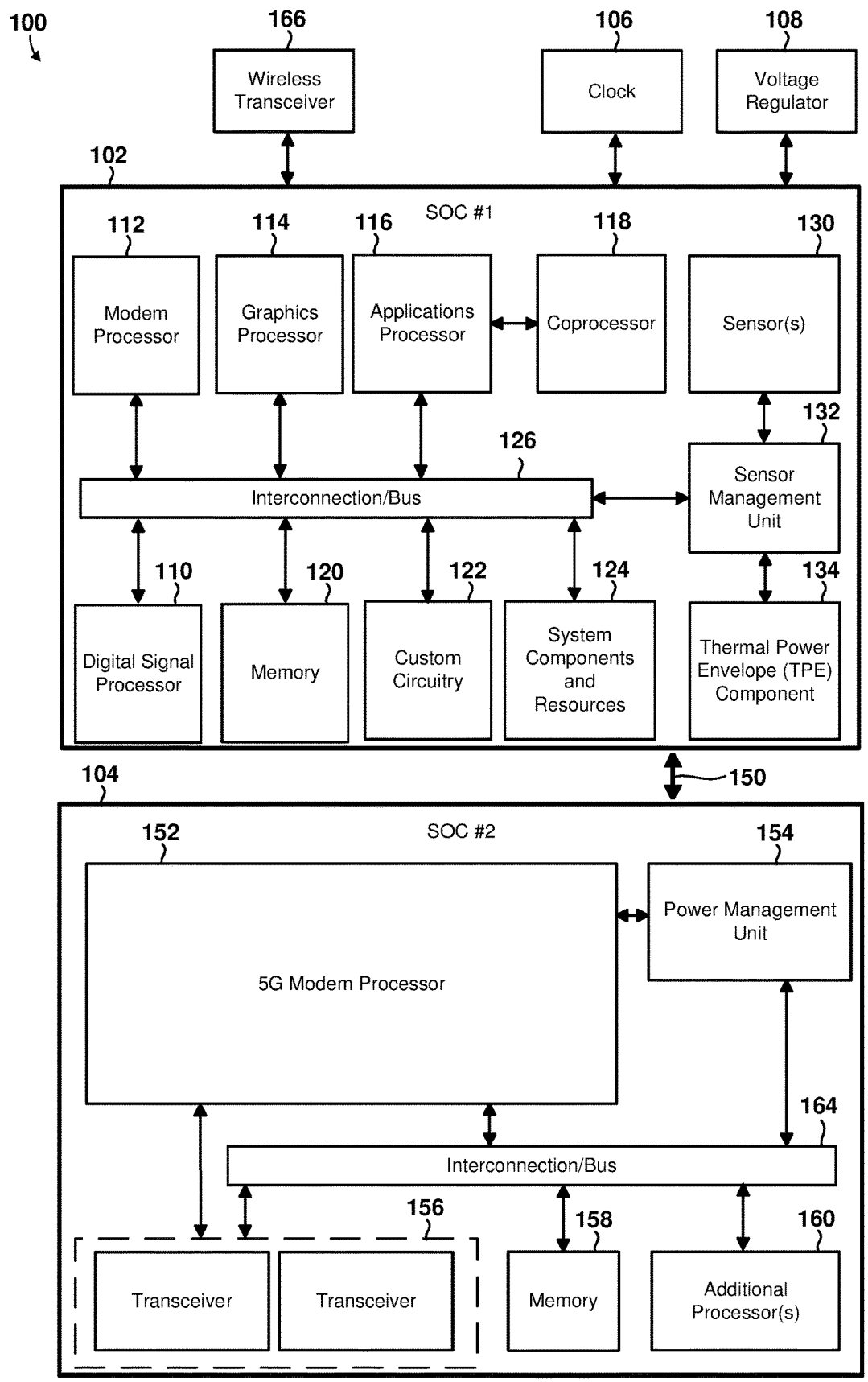
FIG. 1 is a component block diagram illustrating an example computing system that may be configured to provide for reconfiguring memory channel routing in an SoC in the event of a memory channel misbehavior according to some embodiments.

Various embodiments will be described in detail with reference to the accompanying drawings. Wherever possible, the same reference numbers will be used throughout the drawings to refer to the same or like parts. References made to particular examples and embodiments are for illustrative purposes and are not intended to limit the scope of the various aspects or the claims.

Various embodiments include integrated circuit (IC) components, methods and devices for reconfiguring memory (e.g., double data rate (DDR)) channel routing within a system-on-a-chip (SoC) in the event of detected misbehaviors in a manner that provides for improved system reliability. Various embodiments may obtain error information in response to detecting misbehavior in a memory channel communicatively connected to a network interface unit (NIU) of a network-on-a-chip (NoC) that operates within the SoC. Various embodiments may store error information in non-volatile memory, such as flash memory, that may be read upon booting of the SoC. Various embodiments, after identifying a memory channel is misbehaving and storing error information within non-volatile memory, the system may reboot the SoC. Rebooting the SoC with the error information stored in memory may cause the SoC to reconfigure one or more memory channels to communicatively disconnect from or communicatively connect to one or more NIUs in response to reading the stored error information during reboot. In this manner, misbehaving memory channels may be decommissioned from active use, and NIUs may have memory traffic redirected or diverted to functional and/or redundant memory channels.

The term "system-on-a-chip" (SoC) is used herein to refer to a set of interconnected electronic circuits typically, but not exclusively, including a processing device, a memory, and a communication interface. A processing device may include a variety of different types of processors and processor cores, such as a general purpose processor, a central processing unit (CPU), a digital signal processor (DSP), a graphics processing unit (GPU), an accelerated processing unit (APU), a secure processing unit (SPU), a subsystem processor of specific components of the computing device, such as an image processor for a camera subsystem or a display processor for a display, an auxiliary processor, a single-core processor, a multicore processor, a controller, and a microcontroller. A processing device may further embody other hardware and hardware combinations, such as a field programmable gate array (FPGA), an application-specific integrated circuit (ASIC), other programmable logic device, discrete gate logic, transistor logic, performance monitoring hardware, watchdog hardware, and time references. Integrated circuits may be configured such that the components of the integrated circuit reside on a single piece of semiconductor material, such as silicon.

The term "system-in-a-package" (SIP) is used herein to refer to a single module or package that contains multiple resources, computational units, cores or processors on two or more integrated circuit (IC) chips, substrates, or SoCs. For example, a SIP may include a single substrate on which multiple IC chips or semiconductor dies are stacked in a vertical configuration. Similarly, the SIP may include one or more multi-chip modules (MCMs) on which multiple ICs or semiconductor dies are packaged into a unifying substrate. A SIP also may include multiple independent SoCs coupled together via high-speed communication circuitry and packaged in close proximity, such as on a single motherboard or in a single wireless device. The proximity of the SoCs facilitates high speed communications and the sharing of memory and resources.

The term "network-on-a-chip" (NOC) is used herein to refer to a network-based communications subsystem on an IC. In some embodiments, a NOC may be a Clos NOC.

The term "double data rate" (DDR) is used herein to refer to a type of memory configuration. A DDR memory device may transfer data on both rising and falling edges of a clock signal. When referring to "DDR," other memory types may be interchangeable with "DDR." For example, referring to "DDR" may also interchangeably refer to other memory types such as PC-DDR, LPDDR, GDDR, WIDEIO, RAM, SRAM, DRAM, P-RAM, R-RAM, M-RAM, STT-RAM, and embedded DRAM.

The term "memory channel" is used herein to refer to any of a variety of memory channels. For example, a "memory channel" may refer to a channel of any of the following memory types: DDR, PC-DDR, LPDDR, GDDR, WIDEIO, RAM, SRAM, DRAM, P-RAM, R-RAM, M-RAM, STT-RAM, or embedded DRAM channel.

The term "misbehavior" is used herein to refer generally to any of a hard failure, partial failure, intermittent failure, improper or erroneous operation, software error, misconfiguration, or other condition limiting or precluding normal operation of a memory channel.

An SoC may implement including multiple master core processors, and may implement an NoC communicatively connected to those master core processors. The master core processors, which may be non-interleaved master processors or pre-interleaved master processors, may each be connected to the NoC through one or more NIUs. For example, a pre-interleaved master processor may have two, four, or more corresponding NIUs depending on the number of memory (e.g., DDR) channels within the NoC system. Each NIU may be connected to at least one memory channel within the NoC system architecture. For example, an NoC system architecture may include four memory channels, one non-interleaved master processor connected to the NoC via one NIU, and one pre-interleaved master processor connected to the NoC two NIUs. The non-interleaved NIU may be configured to connect to any of the memory channels. The two pre-interleaved NIUs may be configured to connect to two separate memory channels, such that memory traffic from the pre-interleaved master processor may be bifurcated between the NIUs and the memory channels.

In the event of misbehavior (e.g., a hard failure, partial or intermittent failure, high error rates, misconfiguration, etc.) of any of the memory channels, the SoC implementing the NoC system architecture may experience erroneous operations, a hard failure or limited to no functionality. For example, if any memory channel experiences a hard failure, the system will fail. This all-or-nothing memory channel configuration may be especially problematic if the cause for the misbehavior is a hardware failure, as a system reboot will likely not resolve the issue. Software issues causing misbehaviors may also persist through consecutive reboots (e.g., corrupted flash), and the SoC including the misbehaving memory channel(s) may still be nonfunctional or have limited functionality. Various embodiments address failure and/or misbehavior of one or more memory channels by identifying the failed memory channel(s), and rebooting the system with redefined address mapping as described herein.

Various embodiments include methods, SoC designs, processing devices, and memory that are configured to implement the methods for reconfiguring memory channel routing within an SoC. Various embodiments may utilize various error detection methods to determine whether a memory channel may be misbehaving and/or is not communicative (e.g., dynamic random-access memory (DRAM) unable to be reached). Examples of error detection or error checking methods that may be used by the NoC include built-in self-test(s) upon bootup, error correction codes (ECCs) implemented by the NoC and every last-level cache controller (LLCC) among the memory channels, parity bits corresponding to address mapping and control registers, and/or a timeout-per-transaction functional. Various embodiments allow for identification of the source problem memory channel(s), and generation of error information that may be stored in a non-volatile memory space that is accessed as part of the boot process.

Various embodiments may reboot after identifying any problematic memory channels, triggering reconfiguration of the memory routing configuration to exclude or decommission the misbehaving memory channels while redirecting NIU traffic to any remaining functional memory channels. Reconfiguring the memory channel traffic routing may include reading the error information from the non-volatile memory after reboot, and reprogramming control/status registers (CSRs). Reprogramming the CSRs within the NoC system architecture may allow for reprogramming of address maps with each NIU, and may configure any number of multiplexors used for redirecting traffic between the NIUs and the memory channels.

If a memory channel experiences misbehavior (e.g., a hard failure), the system may record this failure and any associated error information, reboot, and reprogram CSRs based on the error information to effectively configure software address mapping with NIUs and hardware data paths along multiplexors. Software logic during bootup may ensure that other modules will not access memory channels during this time and any such re-configurations based on error information may be performed as part of memory channel initialization routines. In some embodiments, full functionality may be regained after a misbehavior of a memory channel if the system has redundant or backup memory channels that was not previously being utilized. In some embodiments, the system may enter a safe mode, or a limited functionality mode, if the system does not have redundant or backup memory channels to replace the misbehaving memory channels. This process flow may allow for systems experiencing continuous misbehaviors to decommission misbehaving memory channels while still retaining some or all functionality.

FIG. 1 is a component block diagram illustrating an example computing system that may be configured to provide for reconfiguring memory (e.g., DDR) channel routing in an SoC in the event of a memory channel failure according to some embodiments. Various implementations may be implemented on a number of single processor and multi-processor computer systems, including an SoC or a SIP. The example illustrated in FIG. 1 is a SIP 100 architecture that may be used in wireless devices and network devices implementing the various implementations.

With reference to FIG. 1, the illustrated example SIP 100 includes two SoCs 102, 104, a clock 106, a voltage regulator 108 and a wireless transceiver 166. In some implementations, the first SoC 102 may operate as central processing unit (CPU) of the wireless device that carries out the instructions of software application programs by performing the arithmetic, logical, control and input/output (I/O) operations specified by the instructions. In some implementations, the second SoC 104 may operate as a specialized processing unit. For example, the second SoC 104 may operate as a specialized 5G processing unit responsible for managing high volume, high speed (such as 5 Gbps, etc.), or very high frequency short wave length (such as 28 GHz mmWave spectrum, etc.) communications.

The first SoC 102 may include a digital signal processor (DSP) 110, a modem processor 112, a graphics processor 114, an application processor 116, one or more coprocessors 118 (such as vector co-processor) connected to one or more of the processors, memory 120, custom circuity 122, system components and resources 124, an interconnection/bus module 126, one or more sensors 130, a sensor management unit 132, and a thermal power envelope (TPE) component 134. The second SoC 104 may include a 5G modem processor 152, a power management unit 154, an interconnection/bus module 164, a plurality of transceivers 156 (e.g., such as sub-6 band transceivers, mmWave transceivers or other wireless transceivers), memory 158, and various additional processors 160, such as an applications processor, packet processor, etc.

Each processor 110, 112, 114, 116, 118, 152, 160 may include one or more cores, and each processor/core may perform operations independent of the other processors/cores. For example, the first SoC 102 may include a processor that executes a first type of operating system (such as FreeBSD, LINUX, OS X, etc.) and a processor that executes a second type of operating system (such as MICROSOFT WINDOWS 10). In addition, any or all of the processors 110, 112, 114, 116, 118, 152, 160 may be included as part of a processor cluster architecture (such as a synchronous processor cluster architecture, an asynchronous or heterogeneous processor cluster architecture, etc.). In some implementations, any or all of the processors 110, 112, 114, 116, 118, 152, 160 may be a component of a processing system. A processing system may generally refer to a system or series of machines or components that receives inputs and processes the inputs to produce a set of outputs (which may be passed to other systems or components of, for example, the first SoC 102 or the second SoC 250). For example, a processing system of the first SoC 102 or the second SoC 104 may refer to a system including the various other components or subcomponents of the first SoC 102 or the second SoC 104.

The processing system of the first SoC 102 or the second SoC 104 may interface with other components of the first SoC 102 or the second SoC 104. The processing system of the first SoC 102 or the second SoC 104 may process information received from other components (such as inputs or signals), output information to other components, etc. For example, a chip or modem of the first SoC 102 or the second SoC 104 may include a processing system, a first interface to output information, and a second interface to receive information. In some cases, the first interface may refer to an interface between the processing system of the chip or modem and a transmitter, such that the first SoC 102 or the second SoC 104 may transmit information output from the chip or modem. In some cases, the second interface may refer to an interface between the processing system of the chip or modem and a receiver, such that the first SoC 102 or the second SoC 104 may receive information or signal inputs, and the information may be passed to the processing system. A person having ordinary skill in the art will readily recognize that the first interface also may receive information or signal inputs, and the second interface also may transmit information.

The first SoC 102 and the second SoC 104 may include various system components, resources and custom circuitry for managing sensor data, analog-to-digital conversions, wireless data transmissions, and for performing other specialized operations, such as decoding data packets and processing encoded audio and video signals for rendering in a web browser. For example, the system components and resources 124 of the first SoC 102 may include power amplifiers, voltage regulators, oscillators, phase-locked loops, peripheral bridges, data controllers, memory controllers, system controllers, access ports, timers, and other similar components used to support the processors and software clients running on a wireless device. The system components and resources 124 or custom circuitry 122 also may include circuitry to interface with peripheral devices, such as cameras, electronic displays, wireless communication devices, external memory chips, etc.

The first SoC 102 and the second SoC 104 may communicate via interconnection/bus module 150. The various processors 110, 112, 114, 116, 118, may be interconnected to one or more memory elements 120, system components and resources 124, and custom circuitry 122, and a sensor management unit 132 via an interconnection/bus module 126. Similarly, the modem processor 152 may be interconnected to the power management unit 154, the transceivers 156, memory 158, and various additional processors 160 via the interconnection/bus module 164. The interconnection/bus module 126, 150, 164 may include an array of reconfigurable logic gates or implement a bus architecture (such as CoreConnect, AMBA, etc.). Communications may be provided by advanced interconnects, such as a high-performance network-on-a-chip (NoC).

The first SoC 102 or the second SoC 104 may further include an input/output module (not illustrated) for communicating with resources external to the SoC, such as a clock 106 and a voltage regulator 108. Resources external to the SoC (such as clock 106, voltage regulator 108) may be shared by two or more of the internal SoC processors/cores.

In addition to the example SIP 100 discussed above, various implementations may be implemented in a wide variety of computing systems, which may include a single processor, multiple processors, multicore processors, or any combination thereof.

Figure 2:
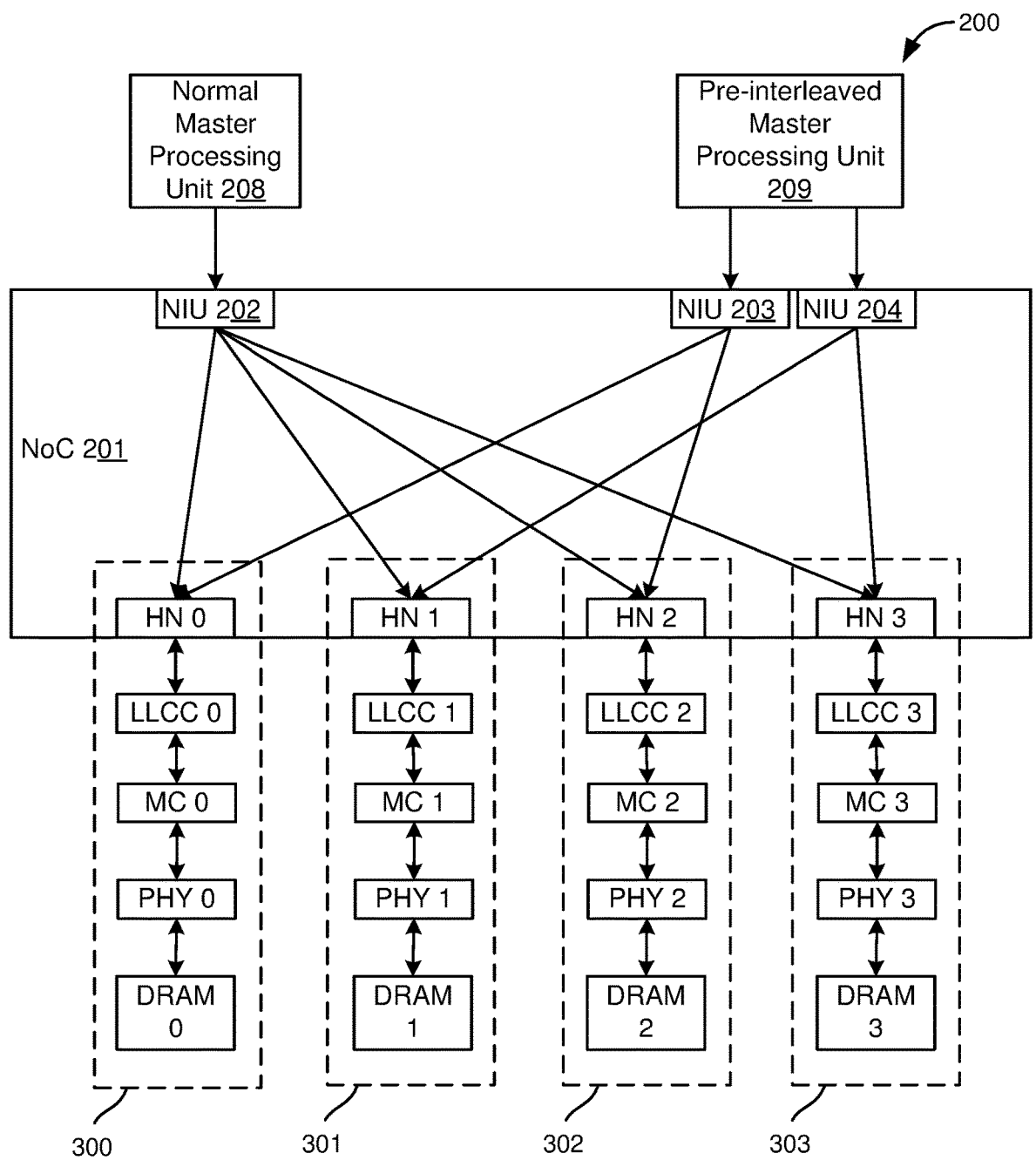
FIG. 2 is a component block diagram illustrating an example network-on-a-chip (NoC) system.

FIG. 2 is a component block diagram illustrating an example NoC system 200. With reference to FIG. 2, the illustrated example NoC system 200 includes an NoC 201, memory (e.g., DDR) channels 300, 301, 302, 303, a normal master processing unit 208, and a pre-interleaved master processing unit 209. The NoC 201 may be implemented within an SoC, and may include various network interface units (NIUs) 202, 203, 204. The NoC 201 may be communicatively connected to one or more processing units, such as a processing core or a GPU. For example, the normal master processing unit 208 may be communicatively connected to the NoC 201 via the normal, or non-interleaved, master NIU 202 to transmit and receive memory transaction data with DRAM, and the pre-interleaved master processing unit 209 may be communicatively connected to the NoC 201 via the pre-interleaved NIUs 203, 204 to transmit and receive memory transaction data with DRAM. The normal master NIU 202 may have hardwired connections to each of the memory channels 300, 301, 302, 303. Pre-interleaved master NIUs 203, 204 may have alternating hardwired connections to the memory channels 300, 301, 302, 303 to bifurcate memory traffic and operations. For example, the pre-interleaved master NIU 203 may have hardwired connections to the memory channels 300, 302, and the pre-interleaved master NIU 204 may have hardwired connections to the memory channels 301, 303.

Figure 3:
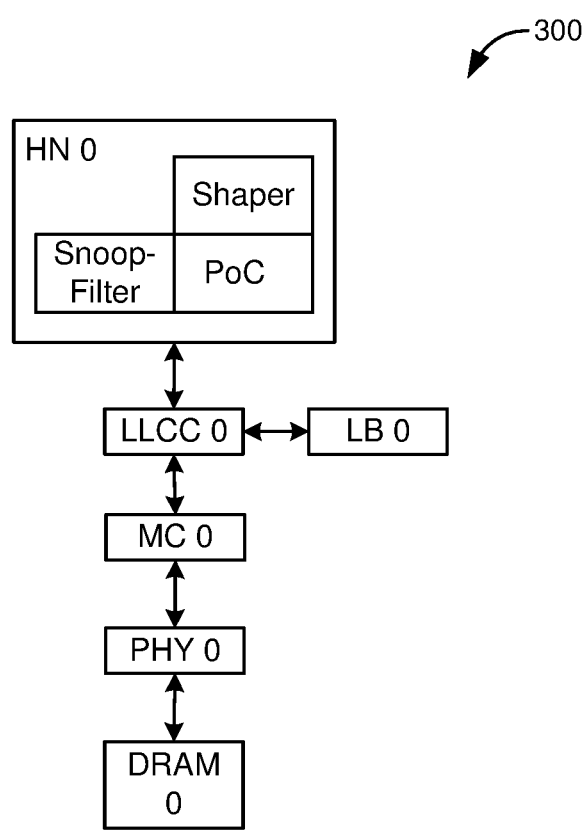
FIG. 3 is a component block diagram illustrating an example double-data rate (DDR) channel.

FIG. 3 is a component block diagram illustrating an example DDR channel 300. Each memory channel 300, 301, 302, 303 may include a home node (HN), a last level cache controller (LLCC), a memory controller (MC), a physical interface (PHY), and a dynamic random-access memory (DRAM). For example, the memory channel 300 may include an HN 0, LLCC 0, MC 0, PHY 0, and DRAM 0. The HN 0 may include a point-of-coherency (PoC), a snoop filter, and a shaper (i.e., a traffic shaper module that enables equitable distribution of memory (e.g., DDR) bandwidth among various master processing units based on the priority of transactions). The LLCC 0 may be communicatively connected to the HN 0, a logical bank (LB) 0, and the MC 0. The MC 0 may be communicatively connected to the PHY 0. The PHY 0 may be communicatively connected to the DRAM 0, for example, through hardwired board or package routing of the SoC implementing the NoC 201. The HN 0, LLCC 0, LB 0, MC 0, and PHY 0 may be referred to collectively as a DDR subsystem (DDRSS). The DDR channel 300 may include the DDRSS and the DRAM 0.

Referring back to FIG. 2, the memory channels 301, 302, 303 may have similar components of the memory channel 300 as described with reference to FIG. 3. For example, the memory channels 301, 302, 303 may each include an LB, and may implement an HN including a shaper, a PoC, and a snoop filter. The HNs for each memory channel 300, 301, 302, 303 may be included as functional blocks within the NoC 201. The HN, LLCC, MC, and PHY of each memory channel 300, 301, 302, 303 may be physically located within the SoC implementing the NoC 201, and the collection of the HN, LLCC, MC, and PHY within each memory channel 300, 301, 302, 303 may be referred to as a DDRSS (e.g., HN 1, LLCC 1, MC 1, and PHY 1 may be referred to as DDRSS 1, HN 2, LLCC 2, MC 2, and PHY 2 may be referred to as DDRSS 2 separate from DDRSS 1, etc.). The DRAM of each memory channel 300, 301, 302, 303 may be physically located externally from the SoC implementing the NoC 201.

Failure or misbehavior (e.g., generating errors, misconfiguration, no longer functioning, etc.) of any of the memory channels 300, 301, 302, 303 will result in complete failure of the SoC implementing the NoC system 200, therefore causing all operations and functionality of the SoC to cease. Behaviors that may cause a system failure may include both software and hardware related misbehavior or failures. For example, any communication interface or pathway between the various components of each memory channel 300, 301, 302, 303 (e.g., HN 0 to LLCC 0; LLCC 1 to LB 1 or MC 1; MC 2 to PHY 2; PHY 3 to DRAM 3; DRAM 2 becomes dislodged from socket, etc.) that experiences interruption or disconnection may result in a complete system failure. As another example, any component with each memory channel 300, 301, 302, 303 that fails, ceases to function properly, or otherwise exhibits misbehavior may cause memory channel failure and therefore system failure despite other components within that memory channel operating correctly (e.g., LB 0 experiences static random-access memory failure while HN 0, LLCC 0, MC 0, PHY 0, DRAM 0 are still functioning or behaving properly; PHY 1 becomes physically damaged, etc.). Various embodiments resolve failure of one or more DDR channels by identifying the misbehaving or failed memory channel(s), and rebooting the system with redefined address mapping as described herein.

Figure 4:
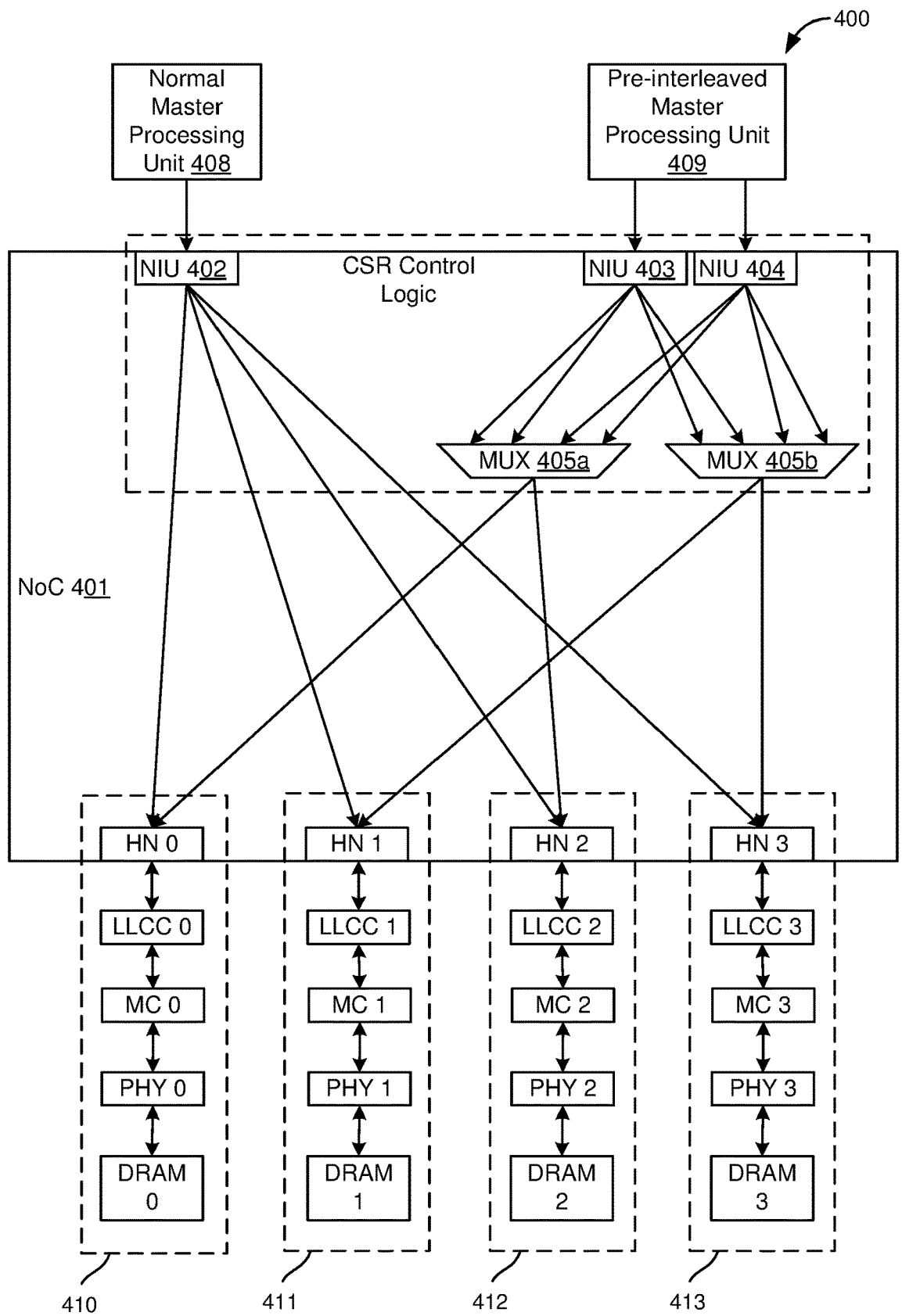
FIG. 4 is a component block diagram illustrating an example NoC system 400 that may be reconfigure memory channel routing within an SoC in the event of a memory channel misbehavior according to some embodiments

FIG. 4 is a component block diagram illustrating an example NoC system 400 that may reconfigure memory channel routing within an SoC in the event of a memory channel failure according to some embodiments. Various embodiments may be implemented on a number of single processor and multiprocessor computer systems, including an SoC or a SIP (e.g., SoC 102, 104). FIG. 4 illustrates an NoC architecture that may be used in wireless devices, network devices, and mobile devices implementing the various implementations. Generally, in the event of a software or hardware failure of a memory (e.g., DDR) channel, the system implementing the failed memory channel may reboot in a safe mode with revised connectivity and address mapping to exclude any failed memory channel(s). Thus, software setting of a NoC and any connected DDRSS may be realigned to a new post-reboot configuration with a reduced number of active memory channels.

The illustrated example NoC system 400 may include an NoC 401, memory channels 410, 411, 412, 413, a normal master processing unit 408, and a pre-interleaved master processing unit 409. The normal master processing unit 408 and the pre-interleaved master processing unit 409 may be physically located within the SoC implementing the NoC 401 (e.g., SoC 102, 104). For ease of illustration, four memory channels are shown. However, more or fewer memory channels may be implemented according to various embodiments. For example, 2, 6, 8, or more memory channels may be utilized when implementing various embodiments. The NoC 401 may be implemented within an SoC (e.g., SoC 102, 104), and may include various network interface units (NIUs) 402, 403, 404.

The NoC 201 may be communicatively connected to one or more processing units, such as a processing core or a GPU. For example, the normal master processing unit 408 may be communicatively connected to the NoC 201 via the normal, or non-interleaved, master NIU 402 to transmit and receive memory transaction data with DRAM. Further, the pre-interleaved master processing unit 409 may be communicatively connected to the NoC 201 via the pre-interleaved NIUs 403, 404 to transmit and receive memory transaction data with DRAM.

A normal, or non-interleaved master, NIU 402 may have hardwired connections to each of the memory channels 410, 411, 412, 413 that may be configurable by the control/status registers (CSRs) of the NoC 401. For example, the CSRs may be programmed terminate or activate hardwired connections from the normal master NIU 402 to any of the memory channels 410, 411, 412, 413 by determining and/or otherwise configuring the address map within the NoC 401 to control the memory channel routing at the normal master NIU 402.

Pre-interleaved master NIUs 403 and 404 may have hardwired and/or configurable connections to the memory channels 410, 411, 412, 413 to bifurcate or otherwise separate memory traffic and operations between the memory channels 410, 411, 412, 413. For example, the pre-interleaved master NIUs 403, 404 may have configurable connections to memory channels 410, 412 through the configurable multiplexor (MUX) 405*a* and may have configurable connections to memory channels 411, 413 through the configurable MUX 405*b*.

In various embodiments, the address maps of each NIU may be programmable and reprogrammable upon reboot by adjusting values within the CSRs. Software of the NoC 401 may determine and/or otherwise (re)configure, via the CSRs, the address mapping within each pre-interleaved master NIU 403, 404 to control the memory channel routing and to inform associated components (e.g., pre-interleaved master processing unit 409, NoC 401) within the NoC system 400 of the (re)configured address mapping. Based on values within the CSRs, software of the NoC 401 may control the MUXs 405*a*, 405*b* to physically (re)route the pre-interleaved master NIUs 403, 404 to active and functioning memory channels according to a bifurcated or otherwise separate traffic configuration (e.g., NIU 403 routed to memory channels 410, 412 through MUX 405*a*, NIU 404 routed to memory channels 411, 413 through MUX 405*b*; NIU 403 routed to memory channels 410, 411 through MUXs 405*a*, 405*b*, NIU 404 routed to memory channels 412, 413 through MUXs 405*a*, 405*b*).

In some embodiments, the pre-interleaved master NIUs 403, 404 may each have hardwired connections to each the memory channels 410, 411, 412, 413 that may be configured by adjusting the CSRs in a similar manner as configuring the routing between the normal master NIU 402 and the DDR channels 410, 411, 412, 413.

In some embodiments, the NoC 401 may include as many pre-interleaved master NIUs connected to a pre-interleaved master processing unit for as many DDR channels existing within the NoC system 400. For example, the pre-interleaved master processing unit 409 may be communicatively connected to four pre-interleaved master NIUs, and each pre-interleaved master NIU may be connected to a single memory channel. For example, a first pre-interleaved master NIU may be connected to memory channel 410, a second pre-interleaved master NIU may be connected to memory channel 411, a third pre-interleaved master NIU may be connected to memory channel 412, and a fourth pre-interleaved master NIU may be connected to memory channel 413.

For ease of illustration, one normal master NIU 402 and two pre-interleaved master NIUs 403, 404 are shown. However, there may be as many or more NIUs for as many master processing units communicatively connected to the NoC 401, and any number of processing units greater than two may be connected to the NoC 401. There may be any number of normal master processing units and corresponding NIUs and any number of pre-interleaved master processing units and corresponding NIUs.

Each memory channel 410, 411, 412, 413 may include an HN, an LLCC, an MC, a PHY, and a DRAM. For example, the memory channel 410 (i.e., channel 0) may include an HN 0, LLCC 0, MC 0, PHY 0, and DRAM 0. Similar to memory channel 300 described with reference to FIG. 3, the HN 0 of the memory channel 410 may include a PoC, a snoop filter, and a shaper. The LLCC 0 may be communicatively connected to the HN 0, an LB 0, and the MC 0. The MC 0 may be communicatively connected to the PHY 0. The PHY 0 may be communicatively connected to the DRAM 0, for example, through hardwired board or package routing of the SoC (e.g., SoC 102, 104) implementing the NoC 401. The HN 0, LLCC 0, LB 0, MC 0, and PHY 0 may be referred to collectively as a memory subsystem (e.g., a DDRSS). The memory channel 410 may include the DDRSS and the DRAM 0.

The memory channels 411, 412, 413 may have similar components of the memory channel 410 as described above. For example, the memory channels 411, 412, 413 may each include an LB, and may implement an HN including a shaper, a PoC, and a snoop filter. The HNs for each memory channel 410, 411, 412, 413 may be included as functional blocks within the NoC 401. The HN, LLCC, MC, and PHY of each memory channel 410, 411, 412, 413 may be physically located within the SoC implementing the NoC 401, and the collection of the HN, LLCC, MC, and PHY within each memory channel 410, 411, 412, 413 may be DDR channels, and thus may be referred to as a DDRSS (e.g., HN 1, LLCC 1, MC 1, and PHY 1 may be referred to as DDRSS 1, HN 2, LLCC 2, MC 2, and PHY 2 may be referred to as DDRSS 2 separate from DDRSS 1, etc.). The DRAM of each memory channel 410, 411, 412, 413 may be physically located externally from the SoC implementing the NoC 401.

The NoC 401 may determine, obtain, or otherwise detect information indicating whether any of the memory channels 410, 411, 412, 413 experience an error causing memory channel failure (i.e., software error recorded by or reported to NoC 401 or any of the LLCCs), or if any of the memory channels 410, 411, 412, 413 cease functioning or exhibit misbehavior without any observable error (i.e., hardware failure; e.g., no observable connection to DRAM 2 from PHY 2).

The NoC 401 may support a variety of methods for determining or otherwise detecting whether one or more memory channels has been compromised, failed, or exhibiting misbehavior (e.g., generating errors, misconfiguration, no longer functioning, etc.). For example, the NoC 401 may support obtaining error correction codes (ECCs) for data transmitted to any of the memory channels 410, 411, 412, 413 from any of the NIUs 402, 403, 404. In response to transmitting memory data to a memory channel from any of the NIUs 402, 403, 404, the NIUs 402, 403, 404 may receive or obtain data corresponding to the transmitted memory data, in which the received data includes bit errors as determined from the ECCs. As another example, the NoC 401 may obtain parity bits to determine or otherwise detect whether address mapping (i.e., between the NIUs 402, 403, 404 and the memory channels 410, 411, 412, 413) or control registers contain any errors, which may indicate that one or more memory channels have been compromised, ceased functioning, or exhibited misbehavior.

As a further example, the NoC 401 may support a timeout-per-transaction function to determine or otherwise detect if any of the memory channels 410, 411, 412, 413 have stopped functioning or exhibited misbehavior. For example, the normal master NIU 402 may transmit a memory transaction to the DRAM 0 of the memory channel 410. In the event that the memory transaction cannot be communicated to the DRAM 0 or the DRAM 0 cannot be reached (i.e., DRAM 0 provides no response to the normal master NIU 402), the normal master NIU 402 may timeout after a configurable amount of time, and inform the NoC 401 that the memory transaction could not be completed and that the DRAM 0 was not able to provide a response to the memory transaction request. Additional failed attempts to perform memory transactions between the pre-interleaved master NIUs 403, 404 and the DRAM 0 of the memory channel 410 may further support the determination by the NoC 401 that the DRAM 0 is not reachable and therefore the memory channel 410 is non-functional or is exhibiting misbehavior.

The NoC 401 may determine or otherwise detect a memory channel is non-functional or exhibiting misbehavior based on obtained error information including ECCs, parity bits, and/or timeout-per transaction functions if at least one NIU communicatively connected to that memory channel in question reports or detects an error or failure. In some embodiments, the NoC 401 may wait until more than one NIU communicatively connected to a memory channel reports an error or failure to the NoC 401 before determining or otherwise detecting that the memory channel in question is non-functional or is exhibiting misbehavior.

The NoC system 400 may include a DDRSS error reporting mechanism such as error reporting performed by the LLCCs of each memory channel 410, 411, 412, 413. The LLCCs within each of the memory channels 410, 411, 412, 413 may determine or otherwise detect if any of the memory channels 410, 411, 412, 413 experience an error causing memory channel failure (i.e., software error recorded by or reported to NoC 401 or any of the LLCCs), or if any of the memory channels 410, 411, 412, 413 cease functioning or exhibit misbehavior without any observable error (i.e., hardware failure; e.g., no observable connection to DRAM 2 from PHY 2). For example, the LLCCs of each memory channel 410, 411, 412, 413 may support ECCs for memory transaction data transmitted to and received from corresponding DRAMs within each memory channel 410, 411, 412, 413. In response to transmitting memory transaction data to respective DRAM, the corresponding LLCC may receive or obtain data corresponding to the transmitted memory data, in which the received or obtained data includes bit errors as determined from the ECCs. As another example, the LLCCs may support ECCs for static random access memory (SRAM) transactions of the LLCC and a respective HN within the immediate memory channel. For example, the LLCC 1 and HN 1 of the DDR channel 411 may each include SRAM, and the LLCC 1 may utilize ECCs to determine if any errors have occurred regarding the cache and tags of the LLCC 1 and the HN 1, which may indicate whether the memory channel 1 has been compromised, ceased to function properly, or exhibited misbehavior. A misbehavior of the SRAMs within the LLCCs and HNs of the memory channels 410, 411, 412, 413 may indicate a hard memory channel failure.

Additional operations may be performed to determine or otherwise detect if one or more memory channels are inoperable or experienced misbehaviors. For example, a built-in self-test may be performed at system bootup (i.e., cold boot or warm boot) for each of the memory channels 410, 411, 412, 413 individually, and for all active and inactive (i.e., configurable) communication pathways from the NIUs 402, 403, 404 to the memory channels 410, 411, 412, 413.

Any of the aforementioned error information, alone or in combination, reported and/or logged by the NoC 401 or LLCCs may be used to determine or otherwise detect when a memory channel has been compromised (i.e., malicious attack) has ceased to function properly, or is otherwise exhibiting misbehavior. After determining that any of the memory channels 410, 411, 412, 413 have exhibited misbehavior, and/or continued to malfunction and exhibit misbehavior, the NoC 401 may determine that a system reboot should be performed in order to provide full or limited functionality.

In some embodiments, the NoC 401 may send a notification message including logged errors of a misbehaving or malfunctioning memory channel to a master processing unit (e.g., master core of the SoC 102 or SoC 104) to instruct the master processing unit to reboot the system, or to allow the master processing unit to make a determination as to when or whether the system should be rebooted based on the notification and error information received from the NoC 401.

Errors determined or otherwise detected or obtained by the NoC 401 and any of the LLCCs may be stored in flash memory, on-die always-on domain, or similar non-volatile computer memory storage medium in a memory location that is accessed or used during rebooting to reconfigure the address mapping of the NIUs 402, 403, 404 and the routing configuration of the MUXs 405a, 405b to route traffic to functioning memory channels and to avoid routing traffic to DDR channels experiencing misbehaviors. The operating system and memory management system may use the error information located within the flash or in an always-on domain to limit processes to usable memory capacity based on the remaining active and functioning memory channels after reboot.

The error information stored, for example, in a flash, may include error information and/or values identifying which memory channels are no longer operational. Upon reboot, the boot code may read this error information and any values that may indicate misbehaving or malfunctioning memory channels to determine whether memory channel routing configuration should be adjusted. Based on the information stored in the flash, the boot code may jump to a specific procedure within its boot code that may be executed to adjust any CSRs according to that specific boot code procedure. In some embodiments, the boot code may jump to a lookup table including the CSR values to be programmed according to the information stored within the flash. For example, the flash may contain information indicating memory channel 411 has failed prior to reboot, and the boot code may execute a procedure to reprogram the CSRs and configure the MUXs 405a, 405b to any functioning memory channel while terminating connections to the memory channel 411. For example, the boot code procedure or lookup table may have a preconfigured alternate mapping based on which memory channel(s) have failed (e.g., memory channel 411 fails, reboot and adjust CSR values to route normal master NIU 402 traffic to memory channel 410 and NIU 403 traffic to memory channel 412). As another example, the boot code procedure may have a dynamic DDR channel assignment procedure, such as adjusting CSR values to change address mapping to split all traffic from NIUs 402, 403, 404 as evenly as possible among all remaining functioning memory channels.

Full device functionality may be achieved after rebooting if the NoC system 400 includes a number of unused memory channels that is equivalent to the number of misbehaving or malfunctioning memory channels identified prior to rebooting. For example, if an NoC system includes six memory channels, of which four memory channels were active and memory DDR channels were inactive prior to reboot (i.e., redundant memory channels), and two of the four active memory channels prior to reboot were identified as misbehaving (e.g., generating errors, misconfiguration, no longer functioning, etc.), the NoC system may utilize the extra two inactive memory channels in place of the two misbehaving memory channels after reboot to achieve full system functionality.

Less than full functionality may be achieved after rebooting if the NoC system 400 includes a number of unused memory channels that is less than the number of misbehaving memory channels identified prior to rebooting. For example, if an NoC system includes eight memory channels, of which six memory channels were active and two memory channels were inactive prior to reboot, and three of the six active channels prior to reboot were identified as misbehaving, the NoC system may utilize the extra two inactive memory channels in place of two of the three misbehaving memory channels after reboot. However, because there are no additional unused memory channels that may be reconfigured to replace functionality of the third identified misbehaving memory channel, the system may reboot with limited functionality, which may be referred to as rebooting in a "safe mode." In this example, in a safe mode, NIUs utilizing that third misbehaving DDR channel prior to the reboot may have traffic diverted via adjusting the CSR values at reboot to utilize one or more of the remaining five active memory channels (e.g., any of (i) the three functioning memory channels of the six memory channels used prior to reboot, and (ii) two of the newly activated back memory channels), while the remaining three memory channels experiencing misbehaviors are disconnected from the NIUs or otherwise decommissioned to reserve computational resources.

In some embodiments in which previously non-utilized, redundant memory channels may be used as backup memory channels after reboot and CSR reprogramming in place of misbehaving decommissioned DDR channels, the DRAM socket of the backup redundant memory channels may not be populated with DRAM. In this situation, portions of a redundant memory channel (i.e., DDRSS components and functional blocks HN, LLCC, MC, PHY) of a memory (e.g., DDR) chain without corresponding DRAM populated may utilize the DRAM of another functioning memory channel. For example, memory channels 410, 412 may perform all DDR channel memory functions for the SoC implementing the NoC 401. memory channels 411, 413 may be redundant, and therefore may not have corresponding DRAM populated to connect with the PHY 1 and PHY 3. In a case in which memory channel 410 experiences a misbehavior, the system may reboot and decommission the memory channel 410 by configuring the first memory channel to be communicatively disconnected from the NIU, and may activate the redundant DDR channel 411 that does not include corresponding DRAM by configuring the second memory channel to be communicatively connected to the NIU. Based on which of the DDRSS portions of the memory channel 410 are misbehaving, the memory channel 411 may utilize functioning portions of the portions the decommissioned memory channel 410 to communicate with the DRAM 0. For example, if the memory channel 410 experienced a misbehavior due to the MC 0 failing, the MC 1 of the memory channel 411 may drive the functioning PHY 0 of the decommissioned memory channel 410 to communicate with the DRAM 0. As another example, if the memory channel 410 experienced a misbehavior due to the PHY 0 failing, the PHY 1 of the memory channel 411 may drive the functioning DRAM 0 of the decommissioned memory channel 410.

Additional hardware connections and multiplexors may be utilized to create communication pathways between the components of each DDRSS chain. For example, a set of multiplexors or a bus switch may be placed between every PHY and every DRAM within the system to allow for each PHY to be configurable to communicate with each DRAM in the event that a redundant memory channel becomes utilized and is not populated with DRAM. Such multiplexors or bus switches that may be utilized mid-DDRSS chain to allow for communication with populated DRAM in another memory channel may be programmed in a similar manner as the MUXs 405a, 405b, in which CSRs are programmed to define the memory channel traffic routing.

In some embodiments, a notification may be sent to a user of the device implementing the NoC 401, either directly from the NoC 401 to a display interface, or indirectly from the NoC 401 to a display interface through a processing unit. The notification to the user may inform the user that the device will be rebooting and operating with full functionality, may be operating in a safe mode with limited functionality, or may request input from the user to choose whether the device should operate in a safe mode with limited functionality based on a reported error included in the notification.

The following example flow is illustrative of various features of some embodiments. Referring to FIG. 4, the normal master NIU 402 may be communicatively connected to the each of the DDR channels 410, 411, 412, 413. The pre-interleaved master NIU 403 may be communicatively connected to the memory channels 410, 412 via the MUX 405a, and the pre-interleaved master NIU 404 may be communicatively connected to the memory channels 411, 413 via the MUX 405b. The address mapping within the NIUs 402, 403, 404 may include bits that identify the routing to various DDR channels. For example, DDR channel 410 may correspond to two bits "00," memory channel 411 may correspond to two bits "01," memory channel 411 may correspond to two bits "10," and memory channel 413 may correspond to two bits "11." Thus, in normal master NIU 402, memory channel address mapping may include bits 00, 01, 10, and 11 signifying that connections between the normal master NIU 402 and memory channels 410, 411, 412, 413 should be configured at bootup or are already configured. In pre-interleaved master NIU 403, memory channel address mapping may include bits 00 and 10 signifying that connections between the pre-interleaved master NIU 403 and memory channels 410, 412 should be configured at bootup or are already configured. In pre-interleaved master NIU 404, memory channel address mapping may include bits 01 and 11 signifying that connections between the pre-interleaved master NIU 404 and memory channels 411, 413 should be configured at bootup or are already configured. In this example, the DDR channel 412 may fail for any number of reasons, and traffic from the normal master NIU 402 and pre-interleaved master NIU 403 may never reach the DRAM 2 of the memory channel 412. In the event that the DDR channel 412 ceases to function, misbehaves, and/or errors recorded by the NoC 401 and/or LLCC 2 indicate a failure, the NoC system 400 may instruct the SoC (e.g., SoC 102, 104) to reboot, or otherwise inform the SoC of the memory channel failure, which may prompt a system reboot.

As an example, upon reboot, both DDR channels 410, 412 connected to the MUX 405*a* may be decommissioned by the CSR decoding (i.e., address mapping changed by adjusting the CSR values), such that the address mapping in each of the NIUs 402, 403, 404 may be reprogrammed. Each of the NIUs 402, 403, 404 may be configured to check only one bit (e.g., bit 8) and select between the two remaining channels (i.e., memory channels 411, 413). For example, the memory channel address mapping bit may include a bit value of "1" within the NIUs 402, 403, 404 after being adjusted by the CSR decoding upon reboot, therefore routing to memory channels 411, 413. Conjunctively, the routing of the MUXs 405*a*, 405*b* may be reconfigured based on the CSR values to allow connections only to memory channels 411, 413. Thus, the routing configuration after reboot and reconfiguration in a safe mode includes normal master NIU 402 and pre-interleaved master NIUs 403, 404 all routed to and sharing memory channels 411, 413 while memory channels 410, 412 remain decommissioned. In this example, pre-interleaved master NIU 404 may not need to be reconfigured, as all of the configured memory channels prior to the reboot were active and functioning. By reconfiguring the address maps of each NIU 402, 403, 404 and reprogramming the MUXs 405*a*, 405*b*, traffic may be diverted to the active and functioning memory channels 411, 413.

As another example, upon reboot, only the memory channels 412 may be decommissioned by the CSR decoding (i.e., address mapping changed by adjusting the CSR values) such that the address mapping in each of the NIUs 402, 403, 404 may be reprogrammed. Each of the NIUs 402, 403, 404 may be configured to still check two bits (e.g., bits 7, 8) and select between any of the remaining channels (i.e., memory channels 410, 411, 413). For example, the memory channel address mapping bit may include a bit values of 00, 01, and 11 within the NIUs 402, 403, 404 after being adjusted by the CSR decoding upon reboot, therefore routing to any of memory channels 410, 411, 413. Conjunctively, the routing of the MUXs 405*a*, 405*b* may be reconfigured based on the CSR values to allow connections only to DDR channels 410, 411, 413 while terminating connections to memory channel 412. Thus, the routing configuration after reboot and reconfiguration in a safe mode includes normal master NIU 402 and pre-interleaved master NIUs 403, 404 all routed to and sharing memory channels 410, 411, 413 while memory channel 412 remain decommissioned. In this example, pre-interleaved master NIU 404 may not need to be reconfigured, as all of the configured DDR channels prior to the reboot were active and functioning. By reconfiguring the address maps of each NIU 402, 403, 404 and reprogramming the MUXs 405*a*, 405*b*, traffic may be diverted to the active and functioning memory channels 410, 411, 413.

In some embodiments, after rebooting and adjusting the CSR values to reconfigure the memory channel traffic routing based on the error information stored in a non-volatile memory component or always-on domain, the NoC 401 or LLCCs of the memory channels 410, 411, 412, 413 may continuously or intermittently determine whether any memory channels that were decommissioned upon reboot have returned to a partially or fully functioning status (i.e., no longer misbehaving). For example, a temporary test configuration may be utilized to determine or otherwise detect if decommissioned memory channels are still nonfunctional or misbehaving after reboot. During this test, software may configure the system to go into a diagnostic test mode to observe and record any errors caused by any decommissioned memory channels, so that normal mission mode applications that continue to use memory channels may not be impacted.

For example, CSR values may be temporarily adjusted to reopen communication pathways (i.e., adjust address mapping at NIUs, open pathways in multiplexors for pre-interleaved configurations) from NIUs to previously decommissioned memory channel(s), and one or more ping message may be sent from one or more NIUs to the DRAM of the decommissioned memory channel(s). Based on the ping messages, the NoC 401 and/or LLCCs may determine or otherwise detect that a previously decommissioned memory channel has regained functionality by comparing currently measured EECs, parity bits, timeout per transaction information (i.e., measured after reboot and temporary memory channel reconfiguration) with EECs, parity bits, timeouts per transaction, and other decommissioned memory channel identifying information stored in the non-volatile memory (i.e., measured before the reboot). If the ping messages do not return any responses, the memory channel may remain nonfunctional or misbehaving and the CSRs may be reprogrammed to revert from the temporary test configuration. If the newly measured information matches the memory channel failure information in the non-volatile memory, the memory channel may remain nonfunctional or misbehaving and the CSRs may be reprogrammed to revert from the temporary test configuration. If the newly measured information does not match the memory channel failure information in the non-volatile memory, the memory channel may have regained some degree of functionality and, based on the newly measured error information, the SoC implementing the NoC 401 may decide to reboot again to attempt to utilize the previously decommissioned memory channel, such as by reconfiguring the first memory channel to be communicatively connected to the NIU and the second memory channel to be communicatively disconnected from the NIU.

In some embodiments, a built-in self-test may be performed upon reboot and prior to reprogramming the CSR values to determine or otherwise detect if the memory channel misbehavior(s) have persisted after reboot. The built-in self-test may include testing whether each NIU can access the DRAM of each memory channel. If the built-in self-test indicates that all memory channels are active, the boot code, prior to reprogramming the CSR values and reconfiguring any multiplexors, may continue to operate in a standard memory channel routing configuration, in which the CSR values remain unchanged.

In some embodiments, after determining or otherwise detecting that a DDR channel has ceased functioning, has been compromised, or is misbehaving, the SoC implementing the NoC 401 may perform a reboot (i.e., cold boot or warm boot) one or more times in a standard memory channel routing configuration to determine or detect if the misbehavior experienced by a memory channel is persistent through a number of reboots. For example, the NoC 401 may detect that memory channel 410 has ceased functioning, and may reboot without adjusting any CSR values based on the recorded error information stored in non-volatile memory space. If the failure persists through one or more reboots as indicated by a built-in self-test and/or newly measured error information including NoC 401 and LLCC error checking, the system may reboot again, adjust the CSR values, and reconfigure any multiplexors according to some embodiments. If the failure does not persist through one or more reboots as indicated by newly measured error information, the system may continue to function in a standard configuration until any new error information indicates a new memory channel failure.

Figure 5:
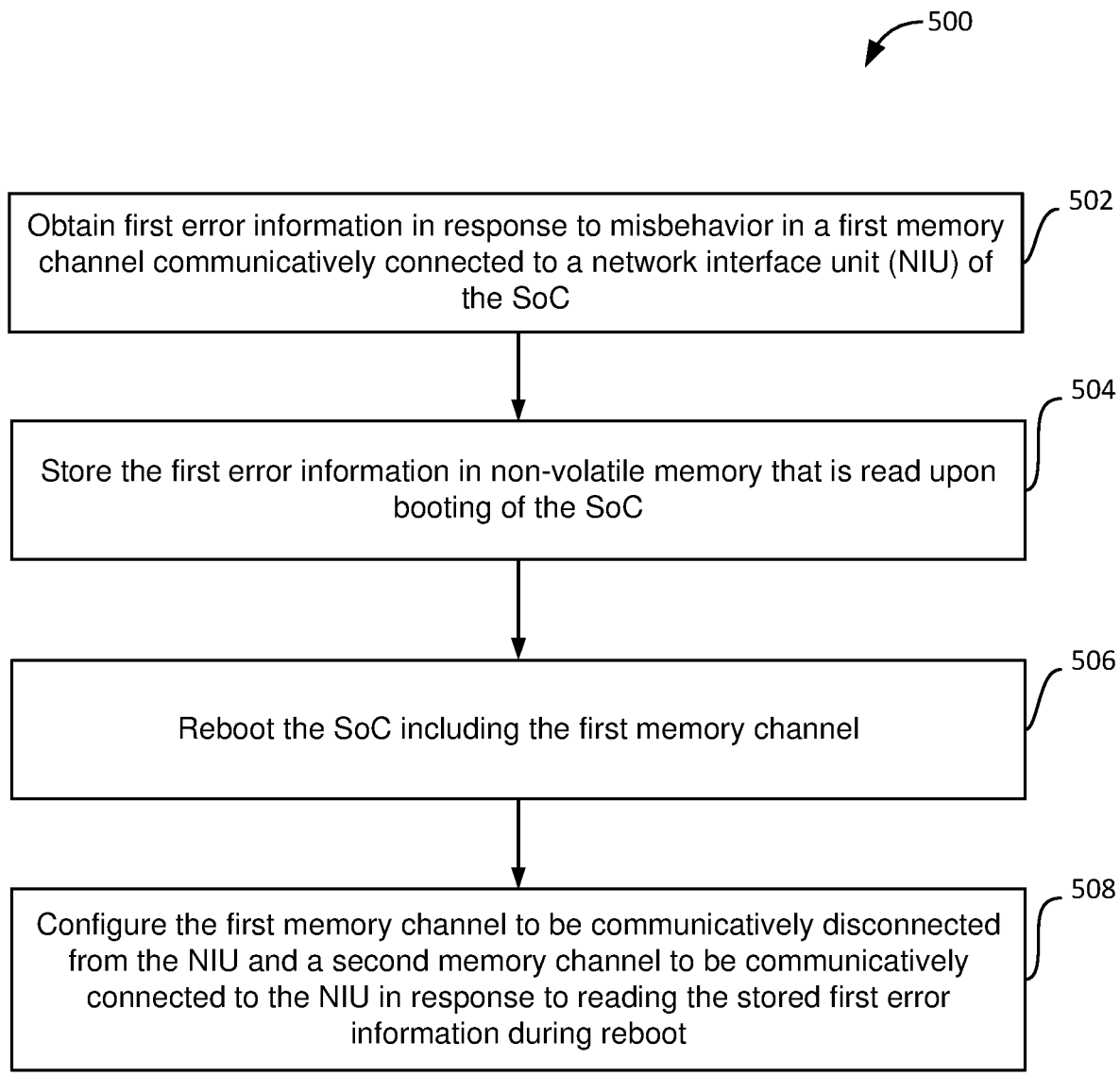
FIG. 5 is a process flow diagram illustrating an embodiment method for reconfiguring memory channel routing within an SoC according to various embodiments.

FIG. 5 is a process flow diagram illustrating an embodiment method 500 for reconfiguring memory (e.g., DDR) channel routing within an SoC in response to misbehavior in a memory channel according to various embodiments. With reference to FIGS. 1-5, the method 500 may be implemented in an SoC configured to perform operations of the method, such as by a processor of the SoC (e.g., processors 110, 112, 114, 116, 118, 152, 160, 408, 409). In some embodiments, the processor (e.g., processors 110, 112, 114, 116, 118, 152, 160, 408, 409) may be configured to perform the operations by processor-executable instruction stored in a non-transitory processor-readable medium (e.g., memory devices 120, 158, DRAM 0, 1, 2, 3). Means for performing each of the operations of the method 500 may be a processor of the SoC, such as within the NoC system 400, such as the processors 110, 112, 114, 116, 118, 152, 160, 408, 409, circuit elements illustrated in and described with reference to FIG. 4.

In block 502, first error information may be obtained in response to misbehavior in a first memory channel communicatively connected to an NIU of the SoC. For example, first error information may be obtained in response to misbehavior in a first memory channel (e.g., memory channel 410, 411, 12, 413) communicatively connected to an NIU (e.g., NIU 402, 403, 403) of the SoC (e.g., SoC 102, 104). First error information may include ECCs, parity bits, and/or timeout-per transaction functions obtained by the NoC, LLCC-based ECCs for memory transaction data transmitted to and received from a corresponding DRAM within a memory channel, LLCC-based ECCs for SRAM transactions regarding cache and tags of the LLCC and a respective HN, built-in self-test information obtained upon boot or reboot, and/or one or more bit values identifying one or more misbehaving memory channels based on the aforementioned error checking methods. The processes in block 502 may be performed as described with reference to FIGS. 1 and 4. Means for performing the operations in block 502 may include a processor of the SoC, such as within the NoC system 400, such as the processors 110, 112, 114, 116, 118, 152, 160, 408, and 409.

In block 504, the first error information may be stored in non-volatile memory that is read upon booting of the SoC. For example, the first error information may be stored within flash memory, on-die always-on domain, or a similar non-volatile computer memory storage medium. Thus, the detected and stored error information may be read from the non-volatile memory space during bootup with the information used to reconfigure memory channel address mapping. The processes in block 504 may be performed as described with reference to FIGS. 1 and 4. Means for performing the operations in block 504 may include a processor of the SoC, such as within the NoC system 400, such as the processors 110, 112, 114, 116, 118, 152, 160, 408, 409, and memory 120, 158.

In block 506, the SoC, which includes the first memory channel, may be rebooted. For example, the SoC (e.g., SoC 102, 104) may include the first memory channel (e.g., memory channel 410, 411, 412, 413). The SoC may determine that a reboot should be performed in response to detecting or otherwise identifying one or more misbehaving memory channels that may cause hard system failures. The processes in block 506 may be performed as described with reference to FIGS. 1 and 4. Means for performing the operations in block 506 may include a processor of the SoC, such as within the NoC system 400, such as the processors 110, 112, 114, 116, 118, 152, 160, 408, 409, and memory 120, 158.

In block 508, the first memory channel may be configured to be communicatively disconnected from the NIU and a second memory channel may be configured to be communicatively connected to the NIU in response to reading the stored first error information during reboot. For example, in response to reading the stored first error information from the non-volatile memory during reboot, the first memory channel (e.g., memory channel 410, 411, 412, 413) may be configured to be communicatively disconnected from the NIU (e.g., NIU 402, 403, 404) and the second memory channel (e.g., memory channel 410, 411, 412, 413) may be configured to be communicatively connected to the NIU.

In some embodiments, configuring the first memory channel to be communicatively disconnected from the NIU and configuring the second memory channel to be communicatively connected to the NIU in response to reading the stored first error information during reboot may include reprogramming control/status registers (CSRs) to adjust the address mapping of the NIU to disconnect the NIU from the first memory channel and to connect the NIU to the second memory channel.

In some embodiments, configuring the first memory channel to be communicatively disconnected from the NIU and configuring the second memory channel to be communicatively connected to the NIU in response to reading the stored first error information during reboot may include reprogramming control/status registers (CSRs) to configure a multiplexor (e.g., MUXs 405a, 405b) to disconnect the NIU from the first memory channel and to connect the NIU to the second memory channel.

In some embodiments, configuring the first memory channel to be communicatively disconnected from the NIU and configuring the second memory channel to be communicatively connected to the NIU in response to reading the stored first error information during reboot may include, in response to the stored first error information indicating misbehavior in a first physical interface (PHY) of the first memory channel, configuring the first memory channel to be communicatively disconnected from the NIU and configuring the second memory channel to be communicatively connected to the NIU, and configuring a second PHY of the second memory channel to be communicatively connected to dynamic random-access memory (DRAM) of the first memory channel. Thus, a redundant, newly-activated memory channel may utilize DRAM of a decommissioned memory channel.

In some embodiments, configuring the first memory channel to be communicatively disconnected from the NIU and configuring the second memory channel to be communicatively connected to the NIU in response to reading the stored first error information during reboot may include, in response to the stored first error information indicating misbehavior in a first memory controller of the first memory channel, configuring the first memory channel to be communicatively disconnected from the NIU and configuring the second memory channel to be communicatively connected to the NIU, and configuring a second memory controller of the second memory channel to be communicatively connected a physical interface (PHY) of the of the first memory channel. Thus, a redundant, newly-activated memory channel may utilize DRAM of a decommissioned memory channel.

The processes in block 508 may be performed as described with reference to FIGS. 1 and 4. Means for performing the operations in block 508 may include a processor of the SoC, such as within the NoC system 400, such as the processors 110, 112, 114, 116, 118, 152, 160, 408, 409, and memory 120, 158.

The order of operations performed in blocks 502-508 is merely illustrative, and the operations of blocks 502-508 may be performed in any order and partially simultaneously in some embodiments. In some embodiments, the method 500 may be performed by a processor of a device independently from, but in conjunction with, an external memory device. For example, the method 500 may be implemented as a software module executing within a processor of an SoC or in dedicated hardware within an SoC that issues commands to establish secure memory channels and access memory of an external memory device and is otherwise configured to take actions and store data as described.

Figure 6A:
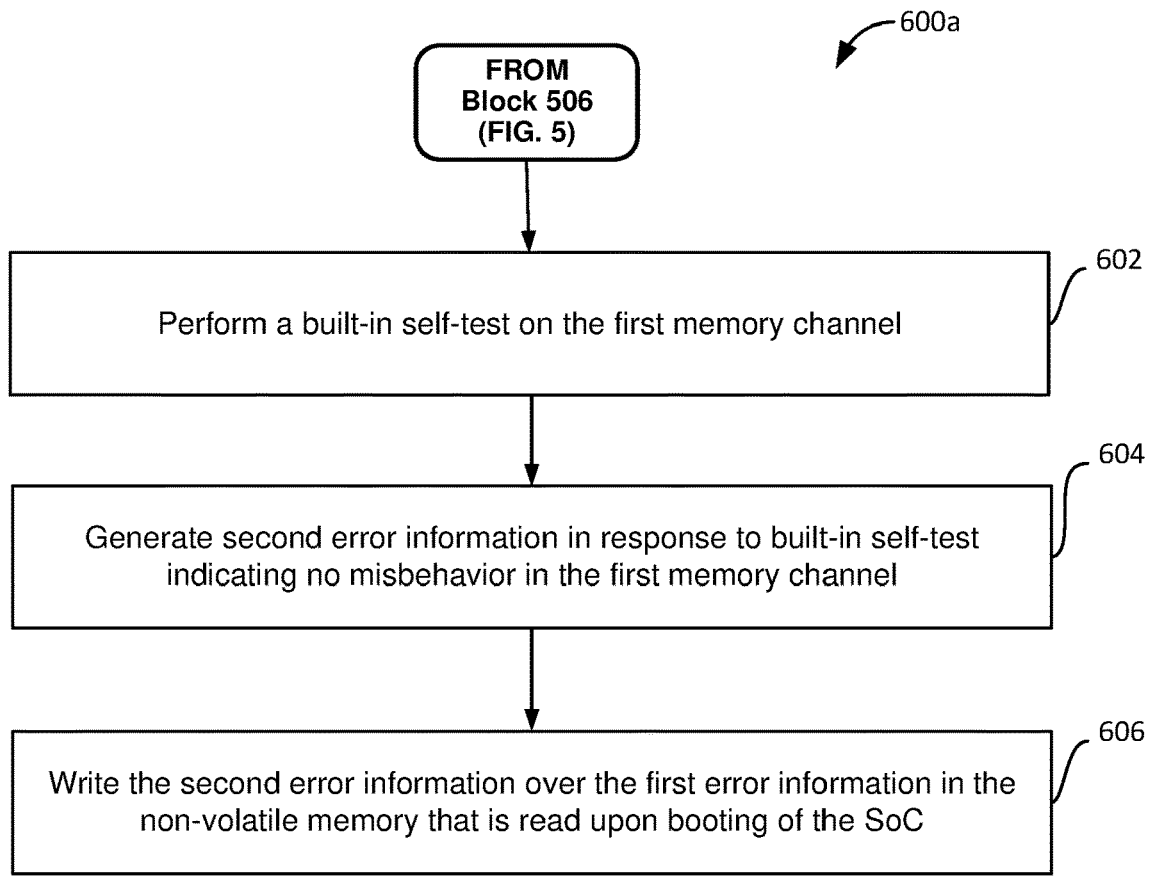
FIG. 6A-6D are process flow diagrams illustrating embodiment methods that may be performed as part of reconfiguring memory channel routing within an SoC according to some embodiments.

FIG. 6A is a process flow diagram illustrating an embodiment method 600a for reconfiguring memory (e.g., DDR) channel routing within an SoC that may be implemented as part of the method 500 according to some embodiments. With reference to FIGS. 1-6A, the method 600a may be implemented in a an SoC configured to perform operations of the method, such as by a processor of the SoC (e.g., processors 110, 112, 114, 116, 118, 152, 160, 408, 409). In some embodiments, the processor (e.g., processors 110, 112, 114, 116, 118, 152, 160, 408, 409) may be configured to perform the operations by processor-executable instruction stored in a non-transitory processor-readable medium (e.g., memory devices 120, 158, DRAM 0, 1, 2, 3). Means for performing each of the operations of the method 600a may be a processor of the SoC, such as within the NoC system 400, such as the processors 110, 112, 114, 116, 118, 152, 160, 408, 409, and/or the like.

Following the operations of block 506 of the method 500 (FIG. 5), a built-in self-test may be performed on the first memory channel in block 602. A built-in self-test may be performed at system bootup (i.e., cold boot or warm boot) for the first memory channel, second memory channel and any other memory channels (e.g., memory channels 410, 411, 412, 413) individually, and for all active and inactive (i.e., configurable) communication pathways from the NIU (e.g., NIUs 402, 403, 404) to the DDR channels. A built-in self-test may be performed upon reboot and prior to reprogramming the CSR values to determine or otherwise detect if the memory channel misbehavior(s) or previously exhibited misbehaviors have persisted after reboot. The built-in self-test may include testing whether each NIU can access the DRAM of each memory channel. The processes in block 602 may be performed as described with reference to FIGS. 1 and 4. Means for performing the operations in block 602 may include a processor of the SoC, such as within the NoC system 400, such as the processors 110, 112, 114, 116, 118, 152, 160, 408, 409.

In block 604, second error information may be generated in response to built-in self-test indicating no misbehavior in the first memory channel. For example, second error information may be obtained in response to misbehavior in a first memory channel (e.g., memory channel 410, 411, 12, 413) communicatively connected to an NIU (e.g., NIU 402, 403, 403) of an NoC (e.g., NoC 401). Second error information may include ECCs, parity bits, and/or timeout-per transaction functions obtained by the NoC, LLCC-based ECCs for memory transaction data transmitted to and received from a corresponding DRAM within a memory channel, LLCC-based ECCs for SRAM transactions regarding cache and tags of the LLCC and a respective HN, built-in self-test information obtained upon boot or reboot, and/or one or more bit values identifying one or more misbehaving memory channels based on the aforementioned error checking methods.

First error information may be obtained prior to a reboot, and second error information may be obtained after that reboot. In some embodiments, the second error information may be compared with the first error information (i.e., as read from the non-volatile memory) to determine whether there has been a change in the functioning statuses of any memory channels.

The processes in block 604 may be performed as described with reference to FIGS. 1 and 4. Means for performing the operations in block 604 may include a processor of the SoC, such as within the NoC system 400, such as the processors 110, 112, 114, 116, 118, 152, 160, 408, 409, and memory 120, 158.

In block 606, the second error information may be written over or otherwise saved so as to replace the first error information in the non-volatile memory that is read upon booting of the SoC. Thus, upon a new reboot, the second error information may be utilized to reprogram CSR values for configuring memory channel traffic routing. In some embodiments, the second error information may be the same as the first error information (i.e., memory channels are not misbehaving, or any misbehaving memory channels are persistently misbehaving after reboot). The processes in block 606 may be performed as described with reference to FIGS. 1 and 4. Means for performing the operations in block 606 may include a processor of the SoC, such as within the NoC system 400, such as the processors 110, 112, 114, 116, 118, 152, 160, 408, 409, and memory 120, 158.

The order of operations performed in blocks 602-606 is merely illustrative, and the operations of blocks 602-606 may be performed in any order and partially simultaneously in some embodiments. In some embodiments, the method 600a may be performed by a processor of a device independently from, but in conjunction with, an external memory device. For example, the method 600a may be implemented as a software module executing within a processor of an SoC or in dedicated hardware within an SoC that issues commands to establish secure memory channels and access memory of an external memory device and is otherwise configured to take actions and store data as described.

Figure 6B:
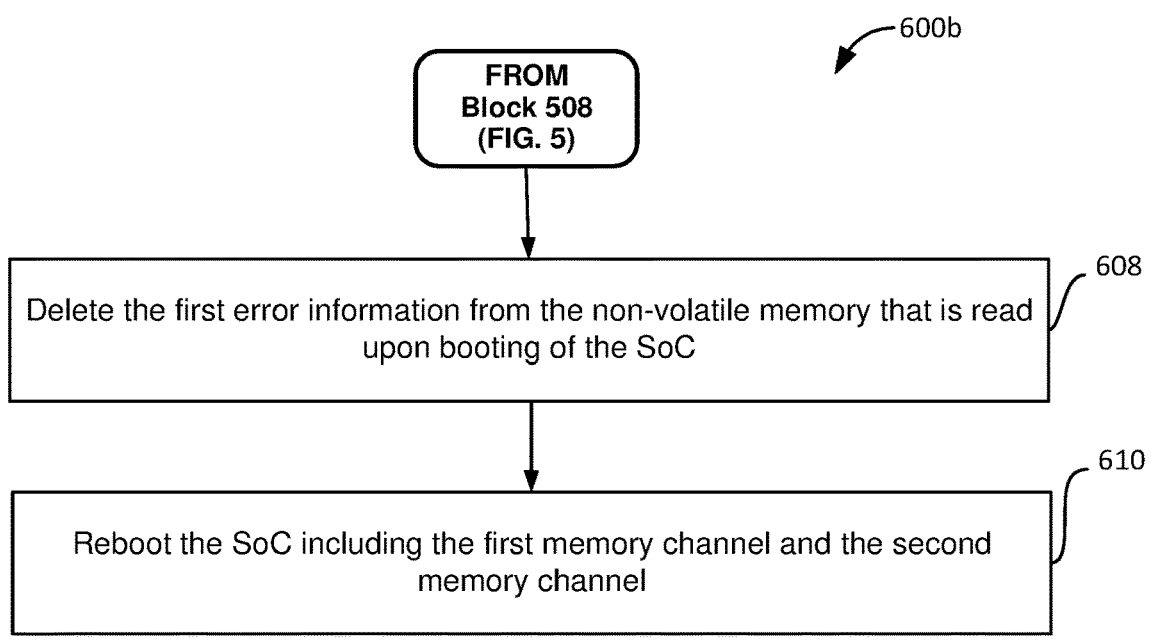

FIG. 6B is a process flow diagram illustrating an embodiment method 600b for reconfiguring memory (e.g., DDR) channel routing within an SoC that may be implemented as part of the method 500 according to some embodiments. With reference to FIGS. 1-6B, the method 600b may be implemented in a an SoC configured to perform operations of the method, such as by a processor of the SoC (e.g., processors 110, 112, 114, 116, 118, 152, 160, 408, 409). In some embodiments, the processor (e.g., processors 110, 112, 114, 116, 118, 152, 160, 408, 409) may be configured to perform the operations by processor-executable instruction stored in a non-transitory processor-readable medium (e.g., memory devices 120, 158, DRAM 0, 1, 2, 3). Means for performing each of the operations of the method 600b may be a processor of the SoC, such as within the NoC system 400, such as the processors 110, 112, 114, 116, 118, 152, 160, 408, 409, and memory 120, 158.

Following the operations of block 508 of the method 500 (FIG. 5), in response to no misbehavior in the first memory channel (e.g., memory channel 410, 411, 12, 413), the first error information may be deleted from the non-volatile memory that is read upon booting of the SoC in block 608. Deleting the error information from the non-volatile memory may, upon reboot, allow the SoC to restore to a standard memory channel routing configuration. The processes in block 608 may be performed as described with reference to FIGS. 1 and 4. Means for performing the operations in block 608 may include a processor of the SoC, such as within the NoC system 400, such as the processors 110, 112, 114, 116, 118, 152, 160, 408, 409, and memory 120, 158.

In block 610, the SoC including the first memory channel and the second memory channel may be rebooted. Rebooting the SoC (e.g., SoC 102, 104) including the first memory channel (e.g., memory channel 410, 411, 412, 413) and the second memory channel (e.g., memory channel 410, 411, 412, 413) with the first error information having been deleted from the non-volatile memory may result in reconfiguring the first memory channel to be communicatively connected to the NIU and configuring the second memory channel to be communicatively disconnected from the NIU. Thus, upon reboot, memory channel routing may be restored to a standard or default configuration. The processes in block 610 may be performed as described with reference to FIGS. 1 and 4. Means for performing the operations in block 610 may include a processor of the SoC, such as within the NoC system 400, such as the processors 110, 112, 114, 116, 118, 152, 160, 408, 409, and memory 120, 158.

The order of operations performed in blocks 608-610 is merely illustrative, and the operations of blocks 608-610 may be performed in any order and partially simultaneously in some embodiments. In some embodiments, the method 600b may be performed by a processor of a device independently from, but in conjunction with, an external memory device. For example, the method 600b may be implemented as a software module executing within a processor of an SoC or in dedicated hardware within an SoC that issues commands to establish secure memory channels and access memory of an external memory device and is otherwise configured to take actions and store data as described.

Figure 6C:
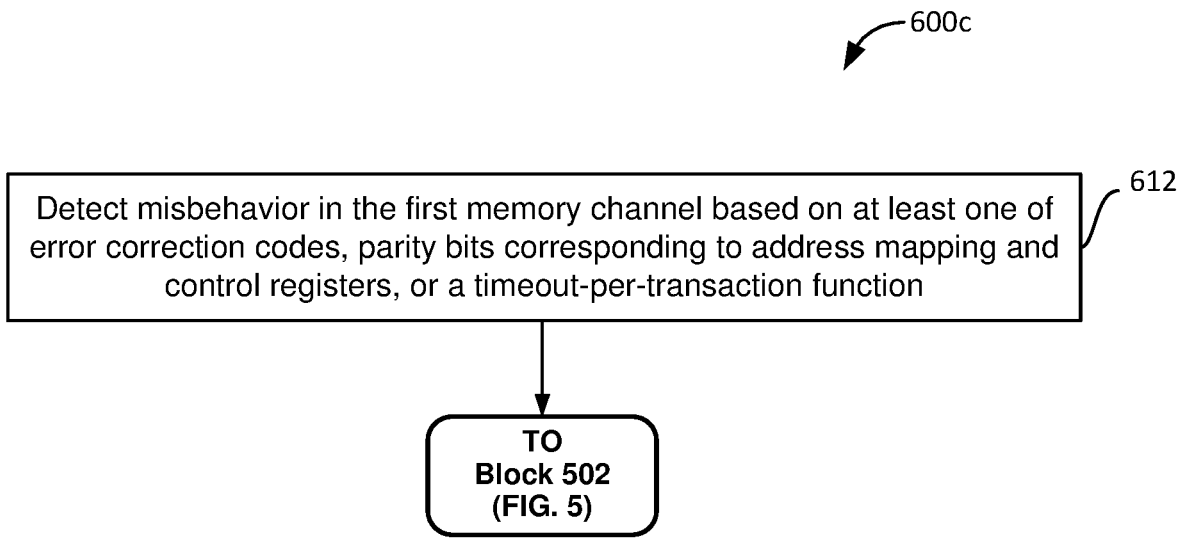

FIG. 6C is a process flow diagram illustrating an embodiment method 600c for reconfiguring memory (e.g., DDR) channel routing within an SoC that may be implemented as part of the method 500 according to some embodiments. With reference to FIGS. 1-6C, the method 600c may be implemented in a an SoC configured to perform operations of the method, such as by a processor of the SoC (e.g., processors 110, 112, 114, 116, 118, 152, 160, 408, 409). In some embodiments, the processor (e.g., processors 110, 112, 114, 116, 118, 152, 160, 408, 409) may be configured to perform the operations by processor-executable instruction stored in a non-transitory processor-readable medium (e.g., memory devices 120, 158, DRAM 0, 1, 2, 3). Means for performing each of the operations of the method 600c may be a processor of the SoC, such as within the NoC system 400, such as the processors 110, 112, 114, 116, 118, 152, 160, 408, 409.

In block 612, misbehavior in the first memory channel may be detected based on at least one of error correction codes, parity bits corresponding to address mapping and control registers, or a timeout-per-transaction function. For example, the misbehavior in the first memory channel (e.g., memory channel 410, 411, 412, 413) may be detected based on ECCs, parity bits, and/or timeout-per transaction functions obtained by the NoC (e.g., NoC 401). The processes in block 612 may be performed as described with reference to FIGS. 1 and 4. Means for performing the operations in block 612 may include a processor of the SoC, such as within the NoC system 400, such as the processors 110, 112, 114, 116, 118, 152, 160, 408, 409.

After performing the operations in block 612, the system may perform the operations in block 502 of the method 500 (FIG. 5) as described.

Figure 6D:
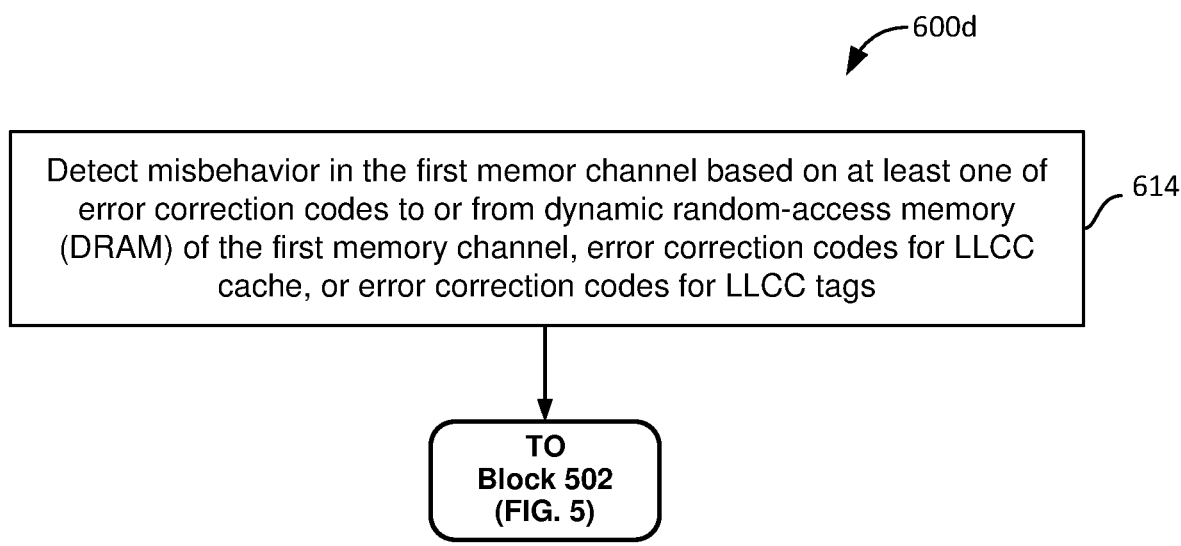

FIG. 6D is a process flow diagram illustrating an embodiment method 600d for reconfiguring memory (e.g., DDR) channel routing within an SoC that may be implemented as part of the method 500 according to some embodiments. With reference to FIGS. 1-6D, the method 600d may be implemented in a an SoC configured to perform operations of the method, such as by a processor of the SoC (e.g., processors 110, 112, 114, 116, 118, 152, 160, 408, 409). In some embodiments, the processor (e.g., processors 110, 112, 114, 116, 118, 152, 160, 408, 409) may be configured to perform the operations by processor-executable instruction stored in a non-transitory processor-readable medium (e.g., memory devices 120, 158, DRAM 0, 1, 2, 3). Means for performing each of the operations of the method 600d may be a processor of the SoC, such as within the NoC system 400, such as the processors 110, 112, 114, 116, 118, 152, 160, 408, 409.

In block 614, misbehavior in the first memory channel may be detected based on at least one of error correction codes to or from dynamic random-access memory (DRAM) of the first memory channel, error correction codes for LLCC cache, or error correction codes for LLCC tags. For example, the misbehavior in the first memory channel (e.g., memory channel 410, 411, 412, 413) may be detected based on LLCC-based ECCs for memory transaction data transmitted to and received from a corresponding DRAM within a memory channel, LLCC-based ECCs for SRAM transactions regarding cache and tags of the LLCC and a respective HN within a DDRSS. The processes in block 614 may be performed as described with reference to FIGS. 1 and 4. Means for performing the operations in block 614 may include a processor of the SoC, such as within the NoC system 400, such as the processors 110, 112, 114, 116, 118, 152, 160, 408, 409.

After performing the operations in block 612, the system may perform the operations in block 502 of the method 500 (FIG. 5) as described.

Figure 7:
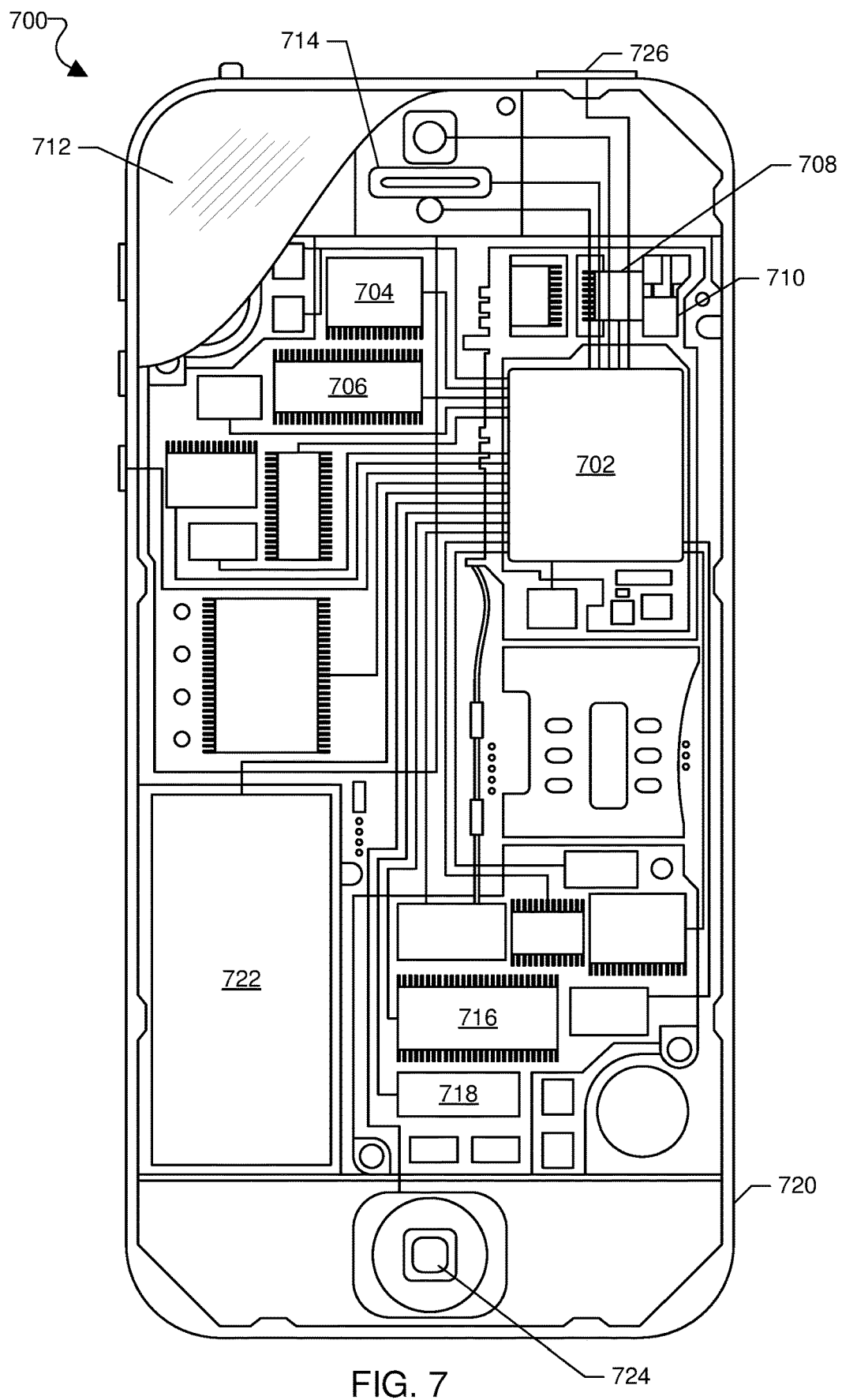
FIG. 7 is a component block diagram illustrating an example wireless communication device suitable for use with the various embodiments.

The various embodiments (including, but not limited to, embodiments described above with reference to FIGS. 1-6A) may be implemented in a wide variety of computing systems including automotive vehicles or other mobile computing devices, an example of which suitable for use with the various embodiments is illustrated in FIG. 7. With reference to FIGS. 1-7, a mobile computing device 700 may include a processor 702 coupled to a touchscreen controller 704 and an internal memory 706. The processor 702 may be one or more multicore integrated circuits designated for general or specific processing tasks. The internal memory 706 may be volatile or non-volatile memory, and may also be secure and/or encrypted memory, or unsecure and/or unencrypted memory, or any combination thereof. Examples of memory types that may be leveraged include but are not limited to DDR, PC-DDR, LPDDR, GDDR, WIDEIO, RAM, SRAM, DRAM, P-RAM, R-RAM, M-RAM, STT-RAM, and embedded DRAM. The touchscreen controller 704 and the processor 702 may also be coupled to a touchscreen panel 712, such as a resistive-sensing touchscreen, capacitive-sensing touchscreen, infrared sensing touchscreen, etc. Additionally, the display of the mobile computing device 700 need not have touch screen capability.

The mobile computing device 700 may have one or more radio signal transceivers 708 (e.g., Peanut, Bluetooth, Zig-Bee, Wi-Fi, RF radio) and antennae 710, for sending and receiving communications, coupled to each other and/or to the processor 702. The transceivers 708 and antennae 710 may be used with the above-mentioned circuitry to implement the various wireless transmission protocol stacks and interfaces. The mobile computing device 700 may include a cellular network wireless modem chip 716 that enables communication via a cellular network and is coupled to the processor.

The mobile computing device 700 may include a peripheral device connection interface 718 coupled to the processor 702. The peripheral device connection interface 718 may be singularly configured to accept one type of connection, or may be configured to accept various types of physical and communication connections, common or proprietary, such as Universal Serial Bus (USB), FireWire, Thunderbolt, or PCIe. The peripheral device connection interface 718 may also be coupled to a similarly configured peripheral device connection port (not shown).

The mobile computing device 700 may also include speakers 714 for providing audio outputs. The mobile computing device 700 may also include a housing 720, constructed of a plastic, metal, or a combination of materials, for containing all or some of the components described herein. The mobile computing device 700 may include a power source 722 coupled to the processor 702, such as a disposable or rechargeable battery. The rechargeable battery may also be coupled to the peripheral device connection port to receive a charging current from a source external to the mobile computing device 700. The mobile computing device 700 may also include a physical button 724 for receiving user inputs. The mobile computing device 700 may also include a power button 726 for turning the mobile computing device 700 on and off.

Figure 8:
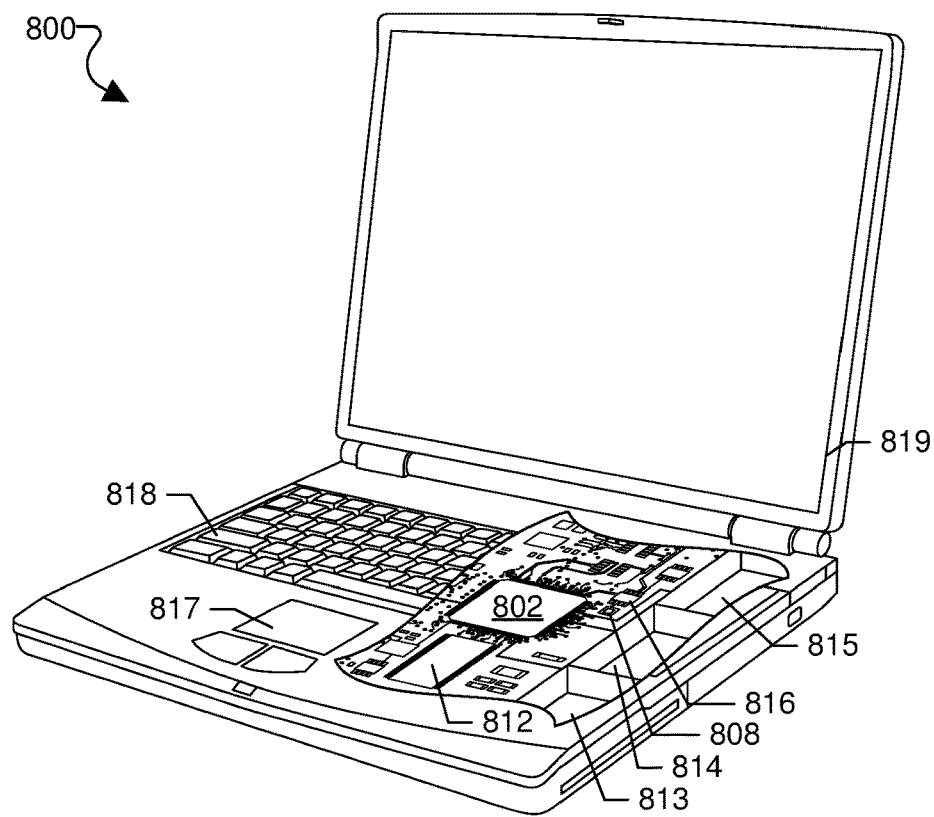
FIG. 8 is a component block diagram illustrating an example computing device suitable for use with the various embodiments.

The various embodiments (including, but not limited to, embodiments described above with reference to FIGS. 1-6D) may be implemented in a wide variety of computing systems include a laptop computer 800 an example of which is illustrated in FIG. 8. With reference to FIGS. 1-8, a laptop computer may include a touchpad touch surface 817 that serves as the computer's pointing device, and thus may receive drag, scroll, and flick gestures similar to those implemented on computing devices equipped with a touch screen display and described above. A laptop computer 800 will typically include a processor 802 coupled to volatile memory 812 and a large capacity non-volatile memory, such as a disk drive 813 of Flash memory. Additionally, the computer 800 may have one or more antenna 808 for sending and receiving electromagnetic radiation that may be connected to a wireless data link and/or cellular telephone transceiver 816 coupled to the processor 802. The computer 800 may also include a floppy disc drive 814 and a compact disc (CD) drive 815 coupled to the processor 802. The laptop computer 800 may include a touchpad 817, a keyboard 818, and a display 819 all coupled to the processor 802. Other configurations of the computing device may include a computer mouse or trackball coupled to the processor (e.g., via a USB input) as are well known, which may also be used in conjunction with the various embodiments.

Figure 9:
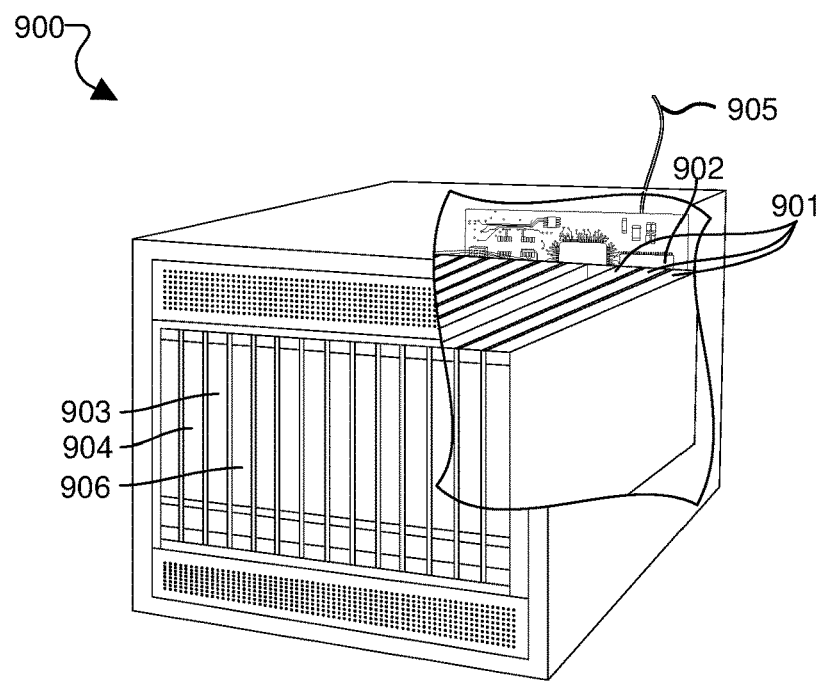
FIG. 9 is a component block diagram illustrating an example server suitable for use with the various embodiments.

The various embodiments (including, but not limited to, embodiments described above with reference to FIGS. 1-6D) may also be implemented in fixed computing systems, such as any of a variety of commercially available servers. With reference to FIGS. 1-9, an example server 900 is illustrated in FIG. 9. Such a server 900 typically includes one or more multicore processor assemblies 901 coupled to volatile memory 902 and a large capacity non-volatile memory, such as a disk drive 904. As illustrated in FIG. 9, multicore processor assemblies 901 may be added to the server 900 by inserting them into the racks of the assembly. The server 900 may also include a floppy disc drive, compact disc (CD) or digital versatile disc (DVD) disc drive 906 coupled to the processor 901. The server 900 may also include network access ports 903 coupled to the multicore processor assemblies 901 for establishing network interface connections with a network 905, such as a local area network coupled to other broadcast system computers and servers, the Internet, the public switched telephone network, and/or a cellular data network (e.g., CDMA, TDMA, GSM, PCS, 3G, 4G, LTE, or any other type of cellular data network).

Implementation examples are described in the following paragraphs. Implementation examples described in terms of example methods further include: the example methods implemented in circuitry and processors configured with processor-executable instructions to perform operations of the example methods; the example methods implemented in means for performing functions of the methods; and the example methods implemented in a non-transitory processor-readable storage medium having stored thereon processor-executable instructions configured to cause a processor to perform operations of the example methods.

Example 1. A method for reconfiguring memory channel routing within a system-on-a-chip (SoC), including: obtaining first error information in response to misbehavior in a first memory channel communicatively connected to a network interface unit (NIU) of the SoC; storing the first error information in non-volatile memory that is read upon booting of the SoC; rebooting the SoC including the first memory channel; and configuring the first memory channel to be communicatively disconnected from the NIU and configuring the second memory channel to be communicatively connected to the NIU in response to reading the stored first error information during reboot.

Example 2. The method of example 1, in which configuring the first memory channel to be communicatively disconnected from the NIU and configuring the second memory channel to be communicatively connected to the NIU in response to reading the stored first error information during reboot includes: reprogramming control/status registers (CSRs) to adjust address mapping of the NIU to disconnect the NIU from the first memory channel and to connect the NIU to the second memory channel.

Example 3. The method of any of examples 1-2, in which configuring the first memory channel to be communicatively disconnected from the NIU and configuring the second memory channel to be communicatively connected to the NIU in response to reading the stored first error information during reboot includes: reprogramming control/status registers (CSRs) to configure a multiplexor to disconnect the NIU from the first memory channel and to connect the NIU to the second memory channel.

Example 4. The method of any of examples 1-3, further including: performing a built-in self-test on the first memory channel; generating second error information in response to the built-in self-test indicating no misbehavior in the first memory channel; and writing the second error information over the first error information in the non-volatile memory that is read upon booting of the SoC.

Example 5. The method of any of examples 1-4, further including in response to no misbehavior in the first memory channel: deleting the first error information from the non-volatile memory that is read upon booting of the SoC; and rebooting the SoC including the first memory channel and the second memory channel, in which rebooting with the first error information deleted from the non-volatile memory results in reconfiguring the first memory channel to be communicatively connected to the NIU and configuring the second memory channel to be communicatively disconnected from the NIU.

Example 6. The method of any of examples 1-5, further including detecting misbehavior in the first memory channel based on at least one of error correction codes, parity bits corresponding to address mapping and control registers, or a timeout-per-transaction function.

Example 7. The method of any of examples 1-6, further including detecting misbehavior in the first memory channel based on at least one of error correction codes to or from dynamic random-access memory (DRAM) of the first memory channel, error correction codes for LLCC cache, or error correction codes for LLCC tags.

Example 8. The method of any of examples 1-7, in which configuring the first memory channel to be communicatively disconnected from the NIU and configuring the second memory channel to be communicatively connected to the NIU in response to reading the stored first error information during reboot includes, in response to the stored first error information indicating misbehavior in a first physical interface (PHY) of the first memory channel: configuring the first memory channel to be communicatively disconnected from the NIU and configuring the second memory channel to be communicatively connected to the NIU; and configuring a second PHY of the second memory channel to be communicatively connected to dynamic random-access memory (DRAM) of the first memory channel.

Example 9. The method of any of examples 1-8, in which configuring the first memory channel to be communicatively disconnected from the NIU and configuring the second memory channel to be communicatively connected to the NIU in response to reading the stored first error information during reboot includes, in response to the stored first error information indicating misbehavior in a first memory controller of the first memory channel: configuring the first memory channel to be communicatively disconnected from the NIU and configuring the second memory channel to be communicatively connected to the NIU; and configuring a second memory controller of the second memory channel to be communicatively connected a physical interface (PHY) of the of the first memory channel.

Example 10. A system-on-a-chip (SoC), including: a network interface unit (NIU); a second memory channel; a first memory channel capable of being communicatively connected to the NIU; a second memory channel capable of being communicatively connected to the NIU; and a non-volatile memory configured to store first error information that is read upon booting of the SoC; in which the SoC is configured to: obtain the first error information in response to misbehavior in the first memory channel when communicatively connected to the NIU; store the first error information in the non-volatile memory; reboot the SoC including the first memory channel; and configure the first memory channel to be communicatively disconnected from the NIU and configure the second memory channel to be communicatively connected to the NIU in response to reading the stored first error information during reboot.

Example 11. The SoC of example 10, in which the SoC is further configured to configure the first memory channel to be communicatively disconnected from the NIU and configure the second memory channel to be communicatively connected to the NIU in response to reading the stored first error information during reboot by: reprogramming control/status registers (CSRs) to adjust address mapping of the NIU to disconnect the NIU from the first memory channel and to connect the NIU to the second memory channel.

Example 12. The SoC of any of examples 10-11, in which the SoC is further configured to configure the first memory channel to be communicatively disconnected from the NIU and configure the second memory channel to be communicatively connected to the NIU in response to reading the stored first error information during reboot by: reprogramming control/status registers (CSRs) to configure a multiplexor to disconnect the NIU from the first memory channel and to connect the NIU to the second memory channel.

Example 13. The SoC of any of examples 10-12, in which the SoC is further configured to: perform a built-in self-test on the first memory channel; generate second error information in response to the built-in self-test indicating no misbehavior in the first memory channel; and write the second error information over the first error information in the non-volatile memory that is read upon booting of the SoC.

Example 14. The SoC of any of examples 10-13, in which the SoC is further configured to, in response to no misbehavior in the first memory channel: delete the first error information from the non-volatile memory that is read upon booting of the SoC; and reboot the SoC including the first memory channel and the second memory channel, in which rebooting with the first error information deleted from the non-volatile memory results in reconfiguring the first memory channel to be communicatively connected to the NIU and configuring the second memory channel to be communicatively disconnected from the NIU.

Example 15. The SoC of any of examples 10-14, in which the SoC is further configured to detect misbehavior in the first memory channel based on at least one of error correction codes, parity bits corresponding to address mapping and control registers, or a timeout-per-transaction function.

Example 16. The SoC of any of examples 10-15, in which the SoC is further configured to detect misbehavior in the first memory channel based on at least one of error correction codes to or from dynamic random-access memory (DRAM) of the first memory channel, error correction codes for LLCC cache, or error correction codes for LLCC tags.

Example 17. The SoC of any of examples 10-16, in which the SoC is further configured to configure the first memory channel to be communicatively disconnected from the NIU and configuring the second memory channel to be communicatively connected to the NIU in response to reading the stored first error information during reboot by: in response to the stored first error information indicating misbehavior in a first physical interface (PHY) of the first memory channel: configuring the first memory channel to be communicatively disconnected from the NIU and configuring the second memory channel to be communicatively connected to the NIU; and configuring a second PHY of the second memory channel to be communicatively connected to dynamic random-access memory (DRAM) of the first memory channel.

Example 18. The SoC of any of examples 10-17, in which the SoC is further configured to configure the first memory channel to be communicatively disconnected from the NIU and configuring the second memory channel to be communicatively connected to the NIU in response to reading the stored first error information during reboot in response to the stored first error information indicating misbehavior in a first memory controller of the first memory channel by: configuring the first memory channel to be communicatively disconnected from the NIU and configuring the second memory channel to be communicatively connected to the NIU; and configuring a second memory controller of the second memory channel to be communicatively connected a physical interface (PHY) of the of the first memory channel.

Example 19. The SoC of any of examples 10-18, in which the first memory channel and the second memory channel are double data rate (DDR) channels.

Computer program code or "program code" for execution on a programmable processor for carrying out operations of the various embodiments may be written in a high-level programming language such as C, C++, C#, Smalltalk, Java, JavaScript, Visual Basic, a Structured Query Language (e.g., Transact-SQL), Perl, or in various other programming languages. Program code or programs stored on a computer readable storage medium as used in this application may refer to machine language code (such as object code) whose format is understandable by a processor.

Various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment.

The foregoing method descriptions and the process flow diagrams are provided merely as illustrative examples and are not intended to require or imply that the blocks of various embodiments must be performed in the order presented. As will be appreciated by one of skill in the art the order of blocks in the foregoing embodiments may be performed in any order. Words such as "thereafter," "then," "next," etc. are not intended to limit the order of the blocks; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm blocks described in connection with the embodiments disclosed herein may be implemented as electronic hardware, computer software, or combinations of both. To clearly illustrate this interchangeability of hardware and software, various illustrative components, blocks, modules, circuits, and blocks have been described above generally in terms of their functionality. Whether such functionality is implemented as hardware or software depends upon the particular application and design constraints imposed on the overall system. Skilled artisans may implement the described functionality in varying ways for each particular application, but such embodiment decisions should not be interpreted as causing a departure from the scope of various embodiments.

The hardware used to implement the various illustrative logics, logical blocks, modules, and circuits described in connection with the embodiments disclosed herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of communication devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

In various embodiments, the functions described may be implemented in hardware, software, firmware, or any combination thereof. If implemented in software, the functions may be stored as one or more instructions or code on a non-transitory computer-readable medium or non-transitory processor-readable medium. The operations of a method or algorithm disclosed herein may be embodied in a processor-executable software module, which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present embodiments. Various modifications to these embodiments will be readily apparent to those skilled in the art, and the generic principles defined herein may be applied to other embodiments without departing from the scope of the embodiments. Thus, various embodiments are not intended to be limited to the embodiments shown herein but are to be accorded the widest scope consistent with the following claims and the principles and novel features disclosed herein.

What is claimed is:

1. A method for reconfiguring memory channel routing within a system-on-a-chip (SoC), comprising:
obtaining first error information in response to misbehavior in a first memory channel communicatively connected to a network interface unit (NIU) of the SoC;

storing the first error information in non-volatile memory that is read upon booting of the SoC;

rebooting the SoC including the first memory channel;

performing a built-in self-test on the first memory channel during the reboot;

generating second error information and writing the second error information over the first error information in the non-volatile memory in response to the built-in-self-test indicating no misbehavior in the first memory channel during the reboot;

configuring the first memory channel to be communicatively disconnected from the NIU and configuring a second memory channel to be communicatively connected to the NIU in response to reading the first error information in the non-volatile memory during the reboot; and rebooting the SoC including the first memory channel and the second memory channel in response to no misbehavior in the first memory channel.

2. The method of claim 1, wherein configuring the first memory channel to be communicatively disconnected from the NIU and configuring the second memory channel to be communicatively connected to the NIU in response to reading the stored first error information during reboot comprises:

reprogramming control/status registers (CSRs) to adjust address mapping of the NIU to disconnect the NIU from the first memory channel and to connect the NIU to the second memory channel.

3. The method of claim 1, wherein configuring the first memory channel to be communicatively disconnected from the NIU and configuring the second memory channel to be communicatively connected to the NIU in response to reading the stored first error information during reboot comprises:

reprogramming control/status registers (CSRs) to configure a multiplexor to disconnect the NIU from the first memory channel and to connect the NIU to the second memory channel.

4. The method of claim 1, further comprising detecting misbehavior in the first memory channel based on at least one of error correction codes, parity bits corresponding to address mapping and control registers, or a timeout-per-transaction function.

5. The method of claim 1, further comprising detecting misbehavior in the first memory channel based on at least one of error correction codes to or from dynamic random-access memory (DRAM) of the first memory channel, error correction codes for LLCC cache, or error correction codes for LLCC tags.

6. The method of claim 1, wherein configuring the first memory channel to be communicatively disconnected from the NIU and configuring the second memory channel to be communicatively connected to the NIU in response to reading the stored first error information during reboot comprises:

in response to the stored first error information indicating misbehavior in a first physical interface (PHY) of the first memory channel:

configuring the first memory channel to be communicatively disconnected from the NIU and configuring the second memory channel to be communicatively connected to the NIU; and configuring a second PHY of the second memory channel to be communicatively connected to dynamic random-access memory (DRAM) of the first memory channel.

7. The method of claim 1, wherein configuring the first memory channel to be communicatively disconnected from the NIU and configuring the second memory channel to be communicatively connected to the NIU in response to reading the stored first error information during reboot comprises:

in response to the stored first error information indicating misbehavior in a first memory controller of the first memory channel:

configuring the first memory channel to be communicatively disconnected from the NIU and configuring the second memory channel to be communicatively connected to the NIU; and configuring a second memory controller of the second memory channel to be communicatively connected a physical interface (PHY) of the first memory channel.

8. A system-on-a-chip (SoC), comprising:

a network interface unit (NIU);

a first memory channel capable of being communicatively connected to the NIU;

a second memory channel capable of being communicatively connected to the NIU; and a non-volatile memory configured to store first error information that is read upon booting of the SoC;

wherein the SoC is configured to:

obtain the first error information in response to misbehavior in the first memory channel when communicatively connected to the NIU;

store the first error information in the non-volatile memory;

reboot the SoC including the first memory channel;

perform a built-in self-test on the first memory channel during the reboot;

generate second error information and write the second error information over the first error information in the non-volatile memory in response to the built-in-self-test indicating no misbehavior in the first memory channel during the reboot;

configure the first memory channel to be communicatively disconnected from the NIU and configure the second memory channel to be communicatively connected to the NIU in response to reading the first error information in the non-volatile memory during the reboot; and reboot the SoC including the first memory channel and the second memory channel in response to no misbehavior in the first memory channel.

9. The SoC of claim 8, wherein the SoC is further configured to configure the first memory channel to be communicatively disconnected from the NIU and configure the second memory channel to be communicatively connected to the NIU in response to reading the stored first error information during reboot by:

reprogramming control/status registers (CSRs) to adjust address mapping of the NIU to disconnect the NIU from the first memory channel and to connect the NIU to the second memory channel.

10. The SoC of claim 8, wherein the SoC is further configured to configure the first memory channel to be communicatively disconnected from the NIU and configure the second memory channel to be communicatively connected to the NIU in response to reading the stored first error information during reboot by:

reprogramming control/status registers (CSRs) to configure a multiplexor to disconnect the NIU from the first memory channel and to connect the NIU to the second memory channel.

11. The SoC of claim 8, wherein the SoC is further configured to detect misbehavior in the first memory channel based on at least one of error correction codes, parity bits corresponding to address mapping and control registers, or a timeout-per-transaction function.

12. The SoC of claim 8, wherein the SoC is further configured to detect misbehavior in the first memory channel based on at least one of error correction codes to or from dynamic random-access memory (DRAM) of the first memory channel, error correction codes for LLCC cache, or error correction codes for LLCC tags.

13. The SoC of claim 8, wherein the SoC is further configured to configure the first memory channel to be communicatively disconnected from the NIU and configure the second memory channel to be communicatively connected to the NIU in response to reading the stored first error information during reboot by in response to the stored first error information indicating misbehavior in a first physical interface (PHY) of the first memory channel:
configuring the first memory channel to be communicatively disconnected from the NIU and configuring the second memory channel to be communicatively connected to the NIU; and
configuring a second PHY of the second memory channel to be communicatively connected to dynamic random-access memory (DRAM) of the first memory channel.

14. The SoC of claim 8, wherein the SoC is further configured to configure the first memory channel to be communicatively disconnected from the NIU and configure the second memory channel to be communicatively connected to the NIU in response to reading the stored first error information during reboot in response to the stored first error information indicating misbehavior in a first memory controller of the first memory channel by:
configuring the first memory channel to be communicatively disconnected from the NIU and the second memory channel to be communicatively connected to the NIU; and
configuring a second memory controller of the second memory channel to be communicatively connected a physical interface (PHY) of the of the first memory channel.

15. The SoC of claim 8, wherein the first memory channel and the second memory channel are double data rate (DDR) channels.

16. A non-transitory processor-readable medium having stored thereon processor-executable instructions configured to cause a processor to reconfigure memory channel routing within a system-on-a-chip (SoC) to perform operations comprising:
obtaining first error information in response to misbehavior in a first memory channel communicatively connected to a network interface unit (NIU) of the SoC;
storing the first error information in non-volatile memory that is read upon booting of the SoC;
rebooting the SoC including the first memory channel;
performing a built-in self-test on the first memory channel during the reboot;
generating second error information and writing the second error information over the first error information in the non-volatile memory in response to the built-in-self-test indicating no misbehavior in the first memory channel during the reboot;
configuring the first memory channel to be communicatively disconnected from the NIU and configuring a second memory channel to be communicatively connected to the NIU in response to reading the first error information in the non-volatile memory during the reboot; and
rebooting the SoC including the first memory channel and the second memory channel in response to no misbehavior in the first memory channel.

* * * * *